(12) United States Patent
Fukui et al.

(10) Patent No.: US 11,515,142 B2
(45) Date of Patent: Nov. 29, 2022

(54) METHOD OF CLEANING SUBSTRATE PROCESSING APPARATUS, AND SUBSTRATE PROCESSING SYSTEM

(71) Applicant: Tokyo Electron Limited, Tokyo (JP)

(72) Inventors: Shogo Fukui, Koshi (JP); Pohan Huang, Hsin-chu (TW)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/014,484

(22) Filed: Sep. 8, 2020

(65) Prior Publication Data
US 2021/0082691 A1    Mar. 18, 2021

(30) Foreign Application Priority Data

Sep. 12, 2019  (JP) .............................. JP2019-166627

(51) Int. Cl.
*H01L 21/02* (2006.01)
*B08B 7/00* (2006.01)
*F26B 5/00* (2006.01)

(52) U.S. Cl.
CPC ...... *H01L 21/02101* (2013.01); *B08B 7/0021* (2013.01); *F26B 5/005* (2013.01); *H01L 21/02043* (2013.01)

(58) Field of Classification Search
CPC ....... H01L 21/02101; H01L 121/02043; B08B 7/0021; F26B 5/005
See application file for complete search history.

(56) References Cited

U.S. PATENT DOCUMENTS

| | | | | |
|---|---|---|---|---|
| 2003/0172954 | A1* | 9/2003 | Verhaverbeke | ... H01L 21/67167 134/1.3 |
| 2004/0020518 | A1* | 2/2004 | DeYoung | .......... H01L 21/02063 134/30 |
| 2005/0191865 | A1* | 9/2005 | Jacobson | .......... H01L 21/31133 438/780 |
| 2006/0254615 | A1* | 11/2006 | Kevwitch | ............... G03F 7/427 134/2 |
| 2012/0048304 | A1* | 3/2012 | Kitajima | ........... H01L 21/67034 134/30 |
| 2018/0033655 | A1* | 2/2018 | Kim | ................... H01L 21/02101 |
| 2018/0096863 | A1* | 4/2018 | Goshi | ............... H01L 21/02057 |
| 2018/0158699 | A1* | 6/2018 | Kitayama | .............. C11D 7/261 |
| 2019/0051519 | A1* | 2/2019 | Tsukano | ................... B08B 3/041 |

(Continued)

FOREIGN PATENT DOCUMENTS

JP    2013-251550 A    12/2013

*Primary Examiner* — Sharidan Carrillo
(74) *Attorney, Agent, or Firm* — Nath, Goldberg & Meyer; Jerald L. Meyer; Tanya E. Harkins

(57) ABSTRACT

There is provided a method of cleaning a substrate processing apparatus in which a drying process of drying a substrate whose surface is wet with a liquid is performed by bring the substrate into contact with a supercritical fluid, the method including: diffusing a first cleaning fluid in an interior of the substrate processing apparatus, the first cleaning fluid being obtained by mixing the supercritical fluid with a solvent containing polar molecules and having a lower boiling point than a boiling point of the liquid; and discharging the first cleaning fluid from the interior of the substrate processing apparatus, that occurs after the diffusing the first cleaning fluid.

18 Claims, 24 Drawing Sheets

(56) References Cited

U.S. PATENT DOCUMENTS

2019/0148182 A1* 5/2019 Yamada .................. B08B 9/093
                                                                    134/37
2021/0082691 A1* 3/2021 Fukui ..................... F26B 5/005

\* cited by examiner

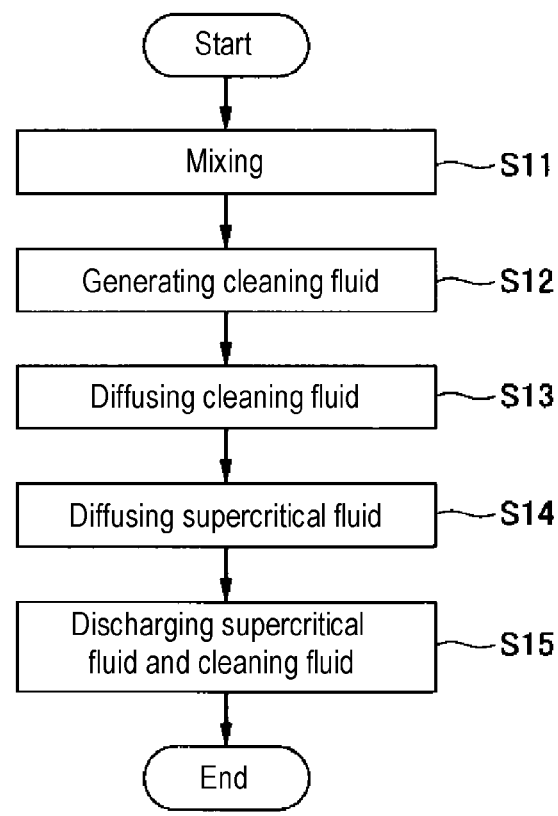

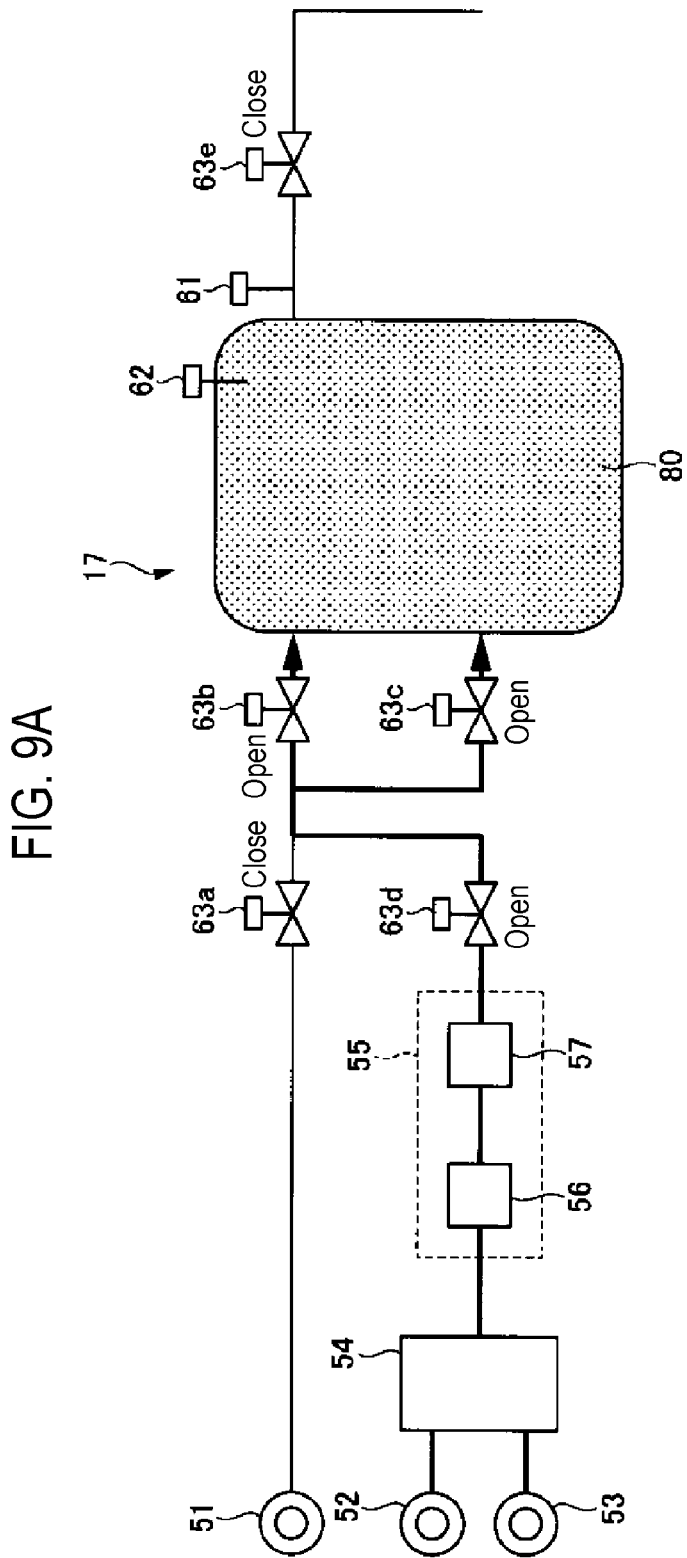

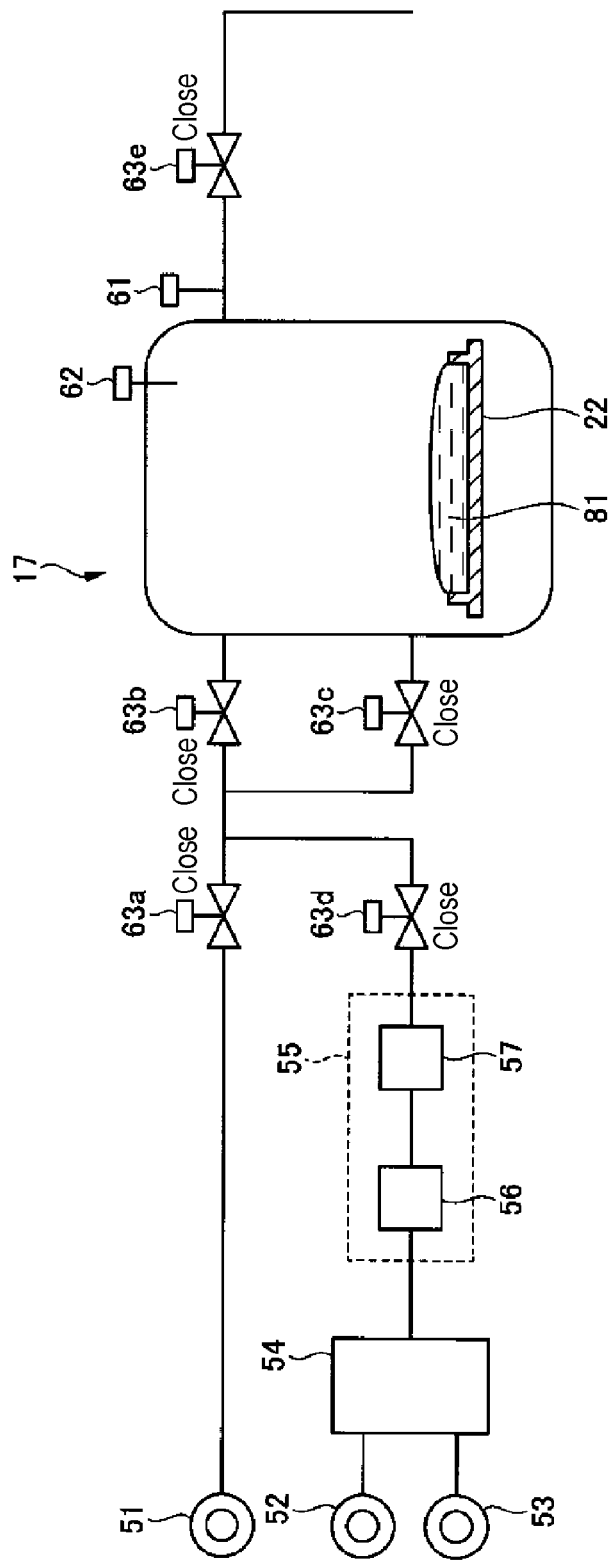

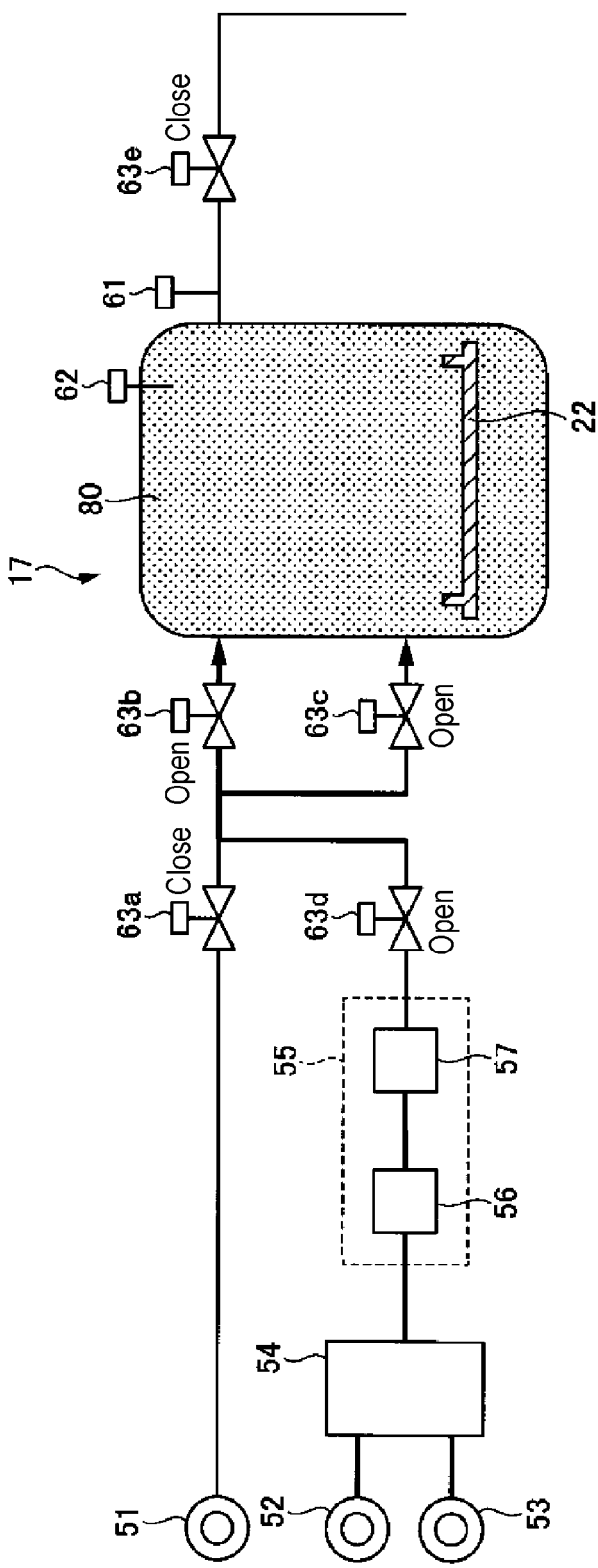

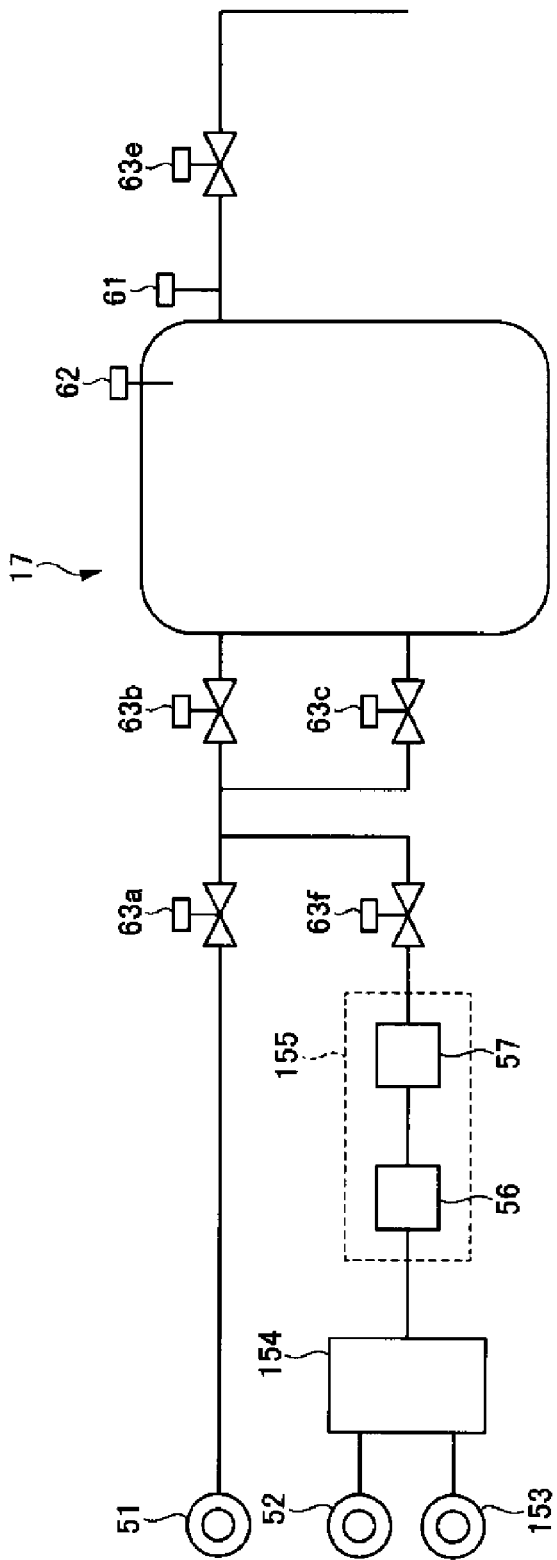

METHOD OF CLEANING SUBSTRATE PROCESSING APPARATUS, AND SUBSTRATE PROCESSING SYSTEM

CROSS-REFERENCE TO RELATED APPLICATION

This application is based upon and claims the benefit of priority from Japanese Patent Application No. 2019-166627, filed on Sep. 12, 2019, the entire contents of which are incorporated herein by reference.

TECHNICAL FIELD

The present disclosure relates to a method for cleaning a substrate processing apparatus, and a substrate processing system.

BACKGROUND

Conventionally, when processing the surface of a substrate such as a semiconductor wafer with liquid and subsequently drying the substrate, there is a known technique for drying the substrate by bringing the surface of the wet substrate, into contact with a processing fluid in a supercritical state.

Patent Document 1 discloses a substrate processing apparatus including a chamber in which a substrate is accommodated, a supply line connected to the chamber so as to supply a supercritical fluid to the surface of the substrate, and an exhaust line connected to the chamber so as to discharge the supercritical fluid inside the chamber.

PRIOR ART DOCUMENT

Patent Document

Patent Document 1: Japanese Laid-Open Patent Publication No. 2013-251550

SUMMARY

According to one embodiment of the present disclosure, there is provided a method of cleaning a substrate processing apparatus in which a drying process of drying a substrate whose surface is wet with a liquid is performed by bring the substrate into contact with a supercritical fluid, the method including: diffusing a first cleaning fluid in an interior of the substrate processing apparatus, the first cleaning fluid being obtained by mixing the supercritical fluid with a solvent containing polar molecules and having a lower boiling point than a boiling point of the liquid; and discharging the first cleaning fluid from the interior of the substrate processing apparatus, that occurs after the diffusing the first cleaning fluid.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 8 is a flowchart illustrating a process of cleaning the drying unit in the first embodiment.

FIG. 9A is a view illustrating the outline of the process of cleaning the drying unit in the first embodiment.

FIG. 16A is a view illustrating the outline of the process of cleaning the drying unit in the third embodiment.

FIG. 16B is a view illustrating the outline of the process of cleaning the drying unit in the third embodiment.

FIG. 17 is a view illustrating an exemplary configuration an entire system of a drying unit in a fourth embodiment.

DETAILED DESCRIPTION

Figure 1:
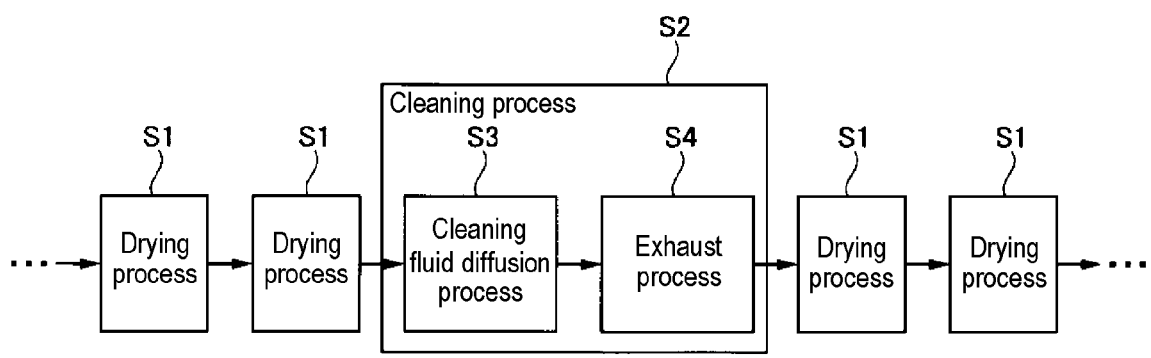
FIG. 1 is a view illustrating an outline of a process of cleaning a substrate processing system according to a first embodiment.

Hereinafter, embodiments of the present disclosure will be described with reference to the drawings. In each drawing, the same or corresponding components will be denoted by the same or corresponding reference numerals, and a description thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

A first embodiment relates to a substrate processing system including a drying unit. The drying unit is an example of a substrate processing apparatus.

<Outline of Process of Cleaning Substrate Processing System>

First, an outline of a process of cleaning a substrate processing system 100 according to a first embodiment will be described with reference to FIG. 1. FIG. 1 is a view illustrating the outline of the process of cleaning the substrate processing system 100 according to the first embodiment.

Figure 2:
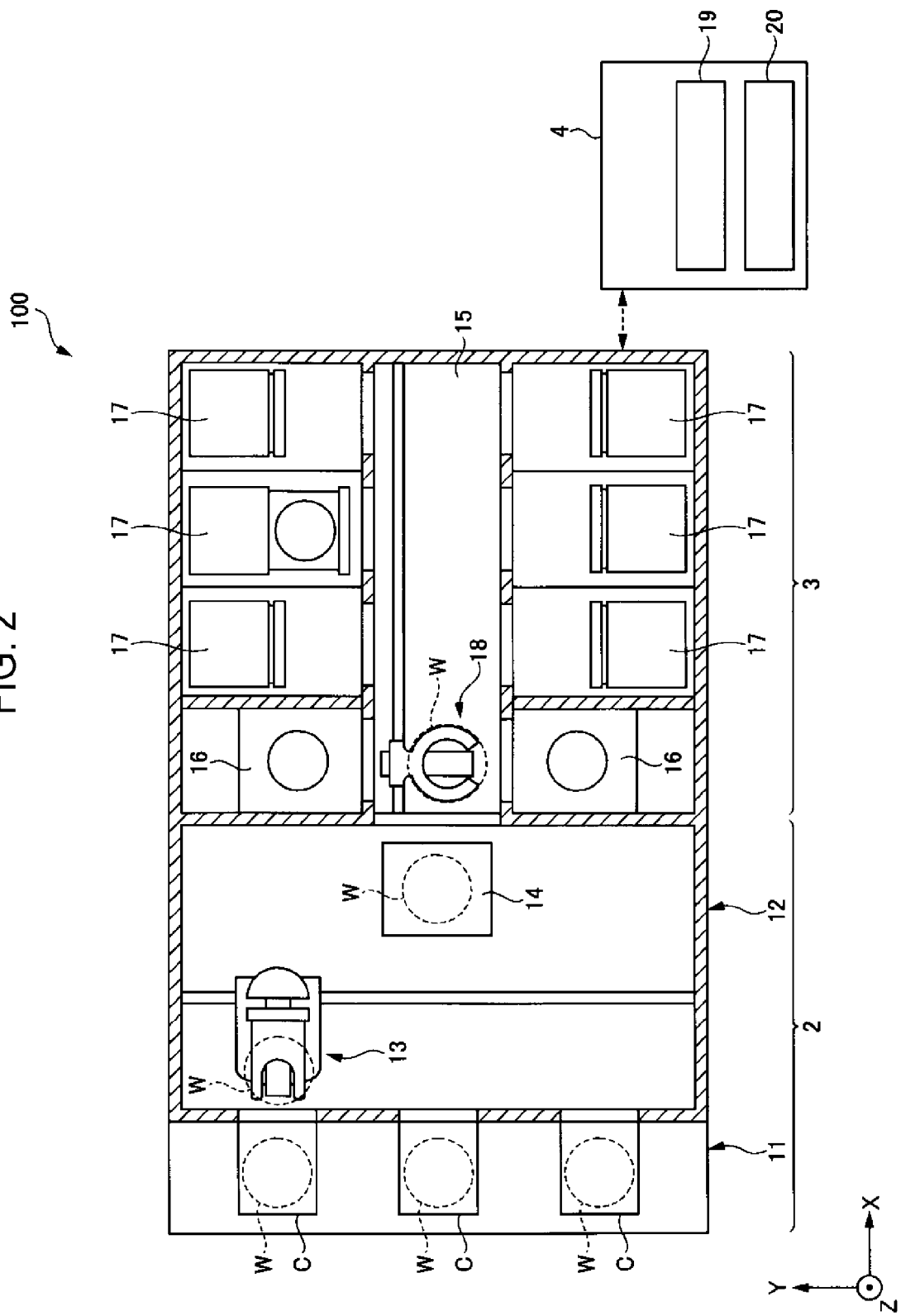
FIG. 2 is a view showing a schematic configuration of the substrate processing system according to the first embodiment.

As illustrated in FIG. 1, in the substrate processing system 100 (see FIG. 2) according to the first embodiment, a drying process S1 using a supercritical fluid is repeatedly performed on a plurality of wafers in a drying unit 17 (see FIG. 2). Details of the drying process S1 will be described later.

Here, in the process of cleaning the substrate processing system 100 according to the first embodiment, a cleaning process S2 is performed in the drying unit 17 of the substrate processing system 100 between the drying processes S1 performed in a repetitive manner. The cleaning process S2 includes a cleaning fluid diffusion process S3 and an exhaust process S4.

Particles may adhere to the wafer during the drying process S1. The present inventors have conducted intensive studies for suppressing the adhesion of particles and found that the particles are residue of a substance to be dried. In addition, it has also been found that, since the substance to be dried is polar molecules but the supercritical fluid used in the drying process S1 is non-polar molecules, the substance to be dried does not dissolve in the supercritical fluid and residue is generated. Further, it has also been found that by supplying a polar molecule solvent together with the supercritical fluid to the drying unit 17, it is possible to remove the residue from the interior of the drying unit 17 and to suppress the adhesion of the residue to the wafers.

Therefore, in the cleaning fluid diffusion process S3, a cleaning fluid 80 (see FIGS. 9A, 13B, and 16B), which is a mixture of a supercritical fluid and a solvent containing polar molecules and having a lower boiling point than isopropyl alcohol (hereinafter, referred to as IPA), is diffused inside the drying unit 17. The cleaning fluid 80 diffused inside the drying unit 17 dissolves the residue of the substance to be dried inside the drying unit 17.

In the subsequent exhaust process S4, the cleaning fluid 80 in which the residue is dissolved is discharged from the interior of the drying unit 17 using a pump or the like. As a result, the residue inside the drying unit 17 is discharged to the outside of the drying unit 17 together with the cleaning fluid 80.

That is, it is possible to remove the residue inside the drying unit 17 by the cleaning fluid diffusion process S3 and the exhaust process S4. Accordingly, the cleaning process S2 of the substrate processing system 100 according to the first embodiment is capable of reducing the residue inside the drying unit 17 in which the drying process S1 using the supercritical fluid is performed and to suppress the adhesion of the residue to the wafer.

<Outline of Substrate Processing System>

Next, a schematic configuration of the substrate processing system 100 according to the first embodiment will be described with reference to FIG. 2. FIG. 2 is a view illustrating the schematic configuration of the substrate processing system 100 according to the first embodiment. For clarification of a positional relationship, an X-axis direction, a Y-axis direction and a Z-axis direction, which are orthogonal to one another in the right-handed system, are defined in the following description, and a positive Z-axis direction is defined as a vertical upward direction.

As illustrated in FIG. 2, the substrate processing system 100 includes a loading/unloading station 2, and a processing station 3. The loading/unloading station 2 and the processing station 3 are provided adjacent to each other.

The loading/unloading station 2 includes a carrier placement part 11 and a transfer part 12. A plurality of carriers C, each configured to accommodate a plurality of semiconductor wafers W (hereinafter, referred to as "wafers W") in a horizontal posture, are placed in the carrier placement part 11.

The transfer part 12 is provided adjacent to the carrier placement part 11, and includes a substrate transfer device 13 and a delivery part 14 provided therein. The substrate transfer device 13 includes a wafer holding mechanism configured to hold the wafer W. In addition, the substrate transfer device 13 is capable of moving in the horizontal direction and the vertical direction and rotating about a vertical axis thereof, and transfers the wafer W between the carrier C and the delivery part 14 using the wafer holding mechanism.

The processing station 3 is provided adjacent to the transfer part 12. The processing station 3 includes a transfer part 15, a plurality of cleaning units 16 and a plurality of drying units 17. The plurality of cleaning units 16 and the plurality of drying units 17 are arranged side by side on opposite sides of the transfer part 15. The arrangements and the numbers of the cleaning units 16 and the drying units 17 illustrated in FIG. 2 are merely examples, and are not limited thereto.

The transfer part 15 includes a substrate transfer device 18 provided therein. The substrate transfer device 18 includes a wafer holding mechanism configured to hold the wafer W. Further, the substrate transfer device 18 is capable of moving in the horizontal direction and the vertical direction and rotating about a vertical axis thereof, and transfers the wafer W between the delivery part 14, the cleaning units 16, and the drying units 17 using the wafer holding mechanism.

The cleaning unit 16 performs a predetermined cleaning process on the wafer W transferred by the substrate transfer device 18. An exemplary configuration of the cleaning unit 16 will be described later.

The drying unit 17 performs the aforementioned drying process on the wafer W which have been subjected to the cleaning process in the cleaning unit 16. An exemplary configuration of the drying unit 17 will be described later.

In addition, the substrate processing system 100 includes a control part 4. The control part 4 is, for example, a computer, and includes a controller 19 and a storage 20.

The controller 19 includes a microcomputer or various circuits including, for example, a central processing unit (CPU), a read only memory (ROM), a random access memory (RAM), and an input/output port. The CPU of such a microcomputer realizes a control (to be described later) by reading and executing a program recorded in the ROM.

In addition, such a program may be recorded in a non-transitory computer-readable recording medium and may be installed on the storage 20 of the control part 4 from the recording medium. The computer-readable recording medium may be, for example, a hard disc (HD), a flexible disc (FD), a compact disc (CD), a magneto-optical disc (MO), a memory card, or the like.

The storage 20 is implemented by, for example, a semiconductor memory element such as a RAM, a flash memory or the like, or a storage device such as a hard disc, an optical disc or the like.

In the substrate processing system 100 configured as above, first, the substrate transfer device 13 of the loading/unloading station 2 takes out the wafer W from the carrier C placed in the carrier placement part 11 and places the taken-out wafer W on the delivery part 14. The wafer W placed on the delivery part 14 is taken out from the delivery part 14 by the substrate transfer device 18 of the processing station 3, and is loaded into the cleaning unit 16.

The wafer W loaded into the cleaning unit 16 is subjected to the cleaning process in the cleaning unit 16 and is then unloaded from the cleaning unit 16 by the substrate transfer device 18. The wafer W unloaded from the cleaning unit 16 is loaded into the drying unit 17 by the substrate transfer device 18, and is subjected to the drying process in the drying unit 17.

The wafer W subjected to the drying process in the drying unit 17 is unloaded from the drying unit 17 and is placed on the delivery part 14 by the substrate transfer device 18. Then, the processed wafer W placed on the delivery part 14 is returned to the carrier C in the carrier placement part 11 by the substrate transfer device 13.

<Outline of Cleaning Unit>

Figure 3:
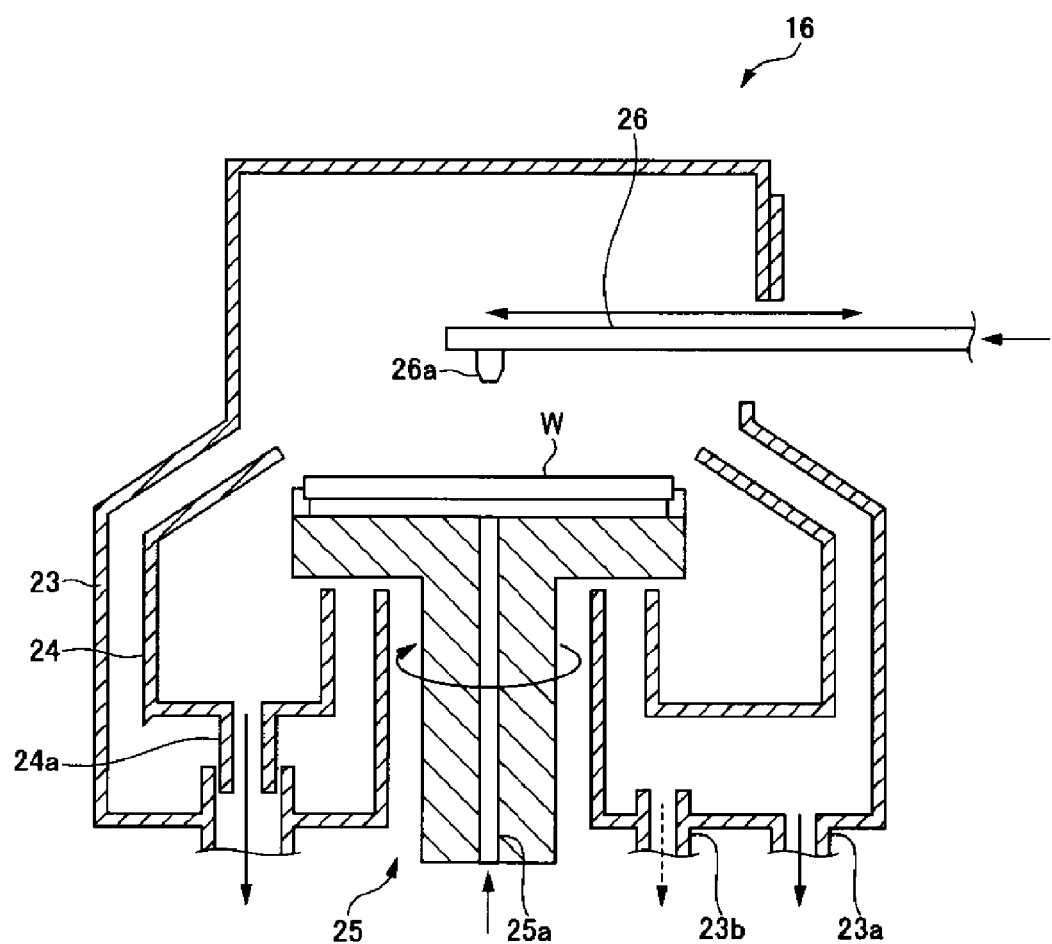
FIG. 3 is a cross-sectional view illustrating a configuration of a cleaning unit.

Next, a schematic configuration of the cleaning unit 16 will be described with reference to FIG. 3. FIG. 3 is a cross-sectional view illustrating the configuration of the cleaning unit 16. The cleaning unit 16 is configured as, for example, a single-wafer-type cleaning apparatus that cleans the wafers W one by one through spin cleaning.

As illustrated in FIG. 3, the cleaning unit 16 holds the wafer W substantially horizontally using a wafer holding mechanism 25 disposed inside an outer chamber 23 that defines a processing space therein, and rotates the wafer holding mechanism 25 around a vertical axis thereof to rotate the wafer W. Then, in the cleaning unit 16, a nozzle arm 26 enters a position above the rotating wafer W, and a chemical liquid and a rinse liquid from a chemical liquid nozzle 26a provided at the tip end of the nozzle arm 26 are supplied in a predetermined order, so that the cleaning process is performed on a front surface of the wafer W.

In the cleaning unit 16, a chemical liquid supply path 25a is also formed inside the wafer holding mechanism 25. A rear surface of the wafer W is also cleaned by the chemical liquid and the rinse liquid supplied from the chemical liquid supply path 25a.

In the aforementioned cleaning process for the wafer W, for example, particles or organic pollutants are removed first using an SC1 liquid (a mixed liquid of ammonia and hydrogen peroxide), which is an alkaline chemical liquid, and subsequently, a rinse cleaning is preformed using deionized water (hereinafter, referred to as "DIW"), which is a rinse liquid. Subsequently, a natural oxide film is removed by a diluted hydrofluoric acid (hereinafter, referred to as "DHF"), which is an acidic chemical liquid, and subsequently, the rinse cleaning is performed using DIW.

Various chemical liquids described above are received by the outer chamber 23 or an inner cup 24 disposed inside the outer chamber 23 and are discharged from a liquid drain port 23a provided in the bottom of the outer chamber 23 or a liquid drain port 24a provided in the bottom of the inner cup 24. In addition, an atmospheric gas inside the outer chamber 23 is exhausted from an exhaust port 23b provided in the bottom of the outer chamber 23.

After the aforementioned rinsing process for the wafer W, an IPA in a liquid state (hereinafter, referred to as an "IPA liquid") is supplied to the front and rear surfaces of the wafer W while rotating the wafer holding mechanism 25, thereby replacing the DIW remaining on the both sides of the wafer W with the IPA liquid. Then, the rotation of the wafer holding mechanism 25 is gently stopped.

The wafer W which has been subjected to the cleaning process in this way, is delivered to the substrate transfer device 18 by a delivery mechanism (not illustrated) provided in the wafer holding mechanism 25 in a state in which an IPA liquid 71 (see FIG. 7) is collected on the front surface of the wafer W (a state in which a film of the IPA liquid is formed on the front surface of the wafer W), and is unloaded from the cleaning unit 16.

Here, the IPA liquid collected on the front surface of the wafer W serves as a drying prevention liquid that prevents pattern collapse from being caused by evaporation (vaporization) of the liquid on the front surface of the wafer W while the wafer W is being transferred from the cleaning unit 16 to the drying unit 17 or while the wafer W is being loaded into the drying unit 17.

The wafer W, which has been subjected to the cleaning process in the cleaning unit 16 and has the IPA liquid collected on the front surface thereof, is transferred to the drying unit 17. In the drying unit 17, a process of bringing a $CO_2$ supercritical fluid 70 (see FIG. 7) into contact with the IPA liquid 71 on the front surface of the wafer W so that the IPA liquid 71 is dissolved in the $CO_2$ supercritical fluid 70 and is removed, and thus drying the wafer W, is performed.

<Outline of Drying Unit>

Figure 4:
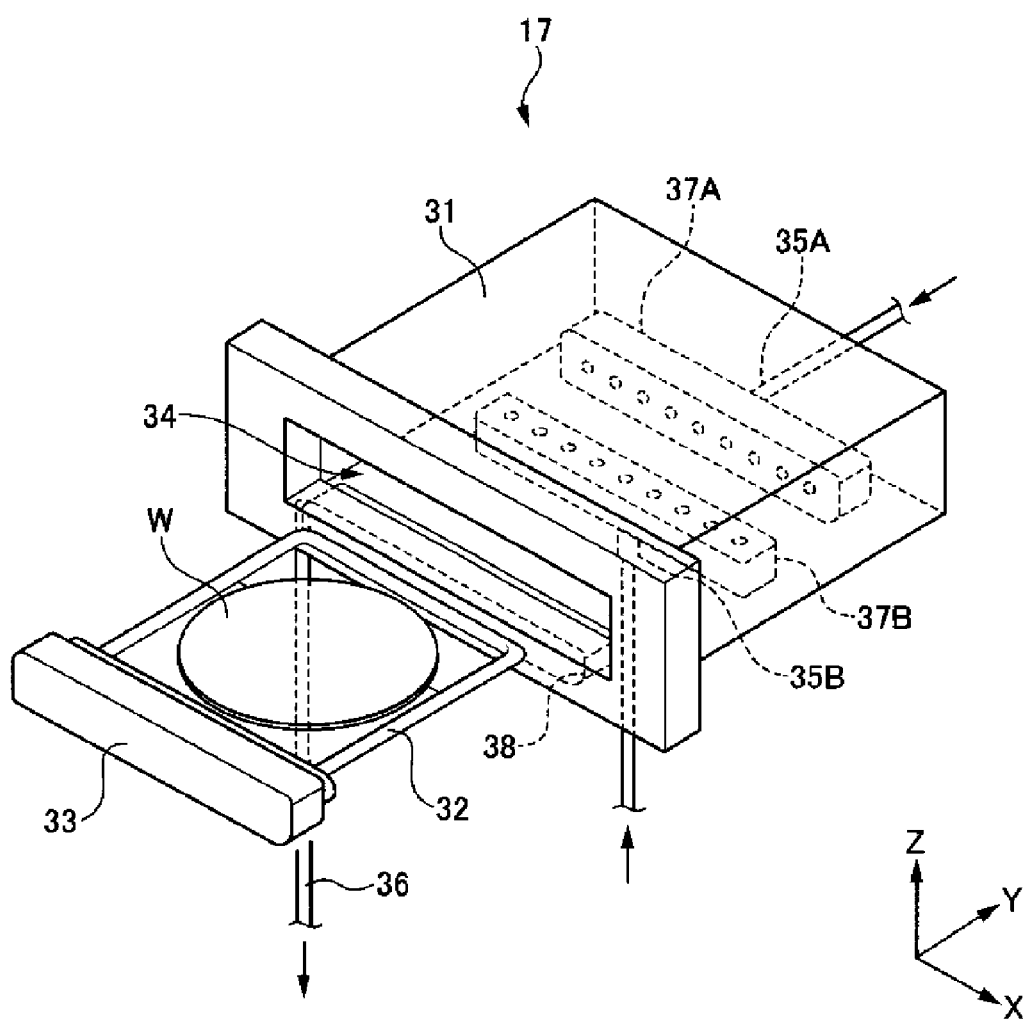
FIG. 4 is an external perspective view illustrating a configuration of a drying unit.

In the following, first, a configuration of the drying unit 17 will be described, and then a configuration of the entire system in the drying unit 17 will be described. FIG. 4 is an external perspective view illustrating the configuration of the drying unit 17.

The drying unit 17 includes a main body 31, a holding plate 32, and a lid member 33. An opening 34 for loading and unloading the wafer W therethrough is formed in the main body 31 having the shape of a housing. The holding plate 32 holds the wafer W to be processed in a horizontal direction. The lid member 33 supports the holding plate 32 and closes the opening 34 when the wafer W is loaded into the main body 31.

The main body 31 is a container in which a processing space capable of accommodating the wafer W having a diameter of, for example, 300 mm, is formed. The wall portion of the main body 31 is provided with supply ports 35A, 35B and a discharge port 36. The supply ports 35A and 35B and the discharge port 36 are respectively connected to supply lines for circulating the supercritical fluid 70 therethrough (see FIG. 7), which are provided on upstream and downstream sides of the drying unit 17. An exemplary configuration of the supply lines will be described later.

The supply port 35A is connected to the side surface of the housing-shaped main body 31 on the side opposite to the opening 34. The supply port 35B is connected to the bottom surface of the main body 31. The discharge port 36 is connected to the lower side of the opening 34. Although FIG. 4 illustrates two supply ports 35A and 35B and one discharge port 36, the numbers of supply ports 35A and 35B and discharge port 36 are not particularly limited.

Inside the main body 31, fluid supply headers 37A and 37B and a fluid discharge header 38 are provided. The fluid supply headers 37A and 37B and the fluid discharge header 38 have large number of openings formed therein, respectively.

The fluid supply header 37A is connected to the supply port 35A, and is provided inside the housing-shaped main body 31 adjacent to the side surface on the side opposite to the opening 34. The large number of openings formed in the fluid supply header 37A face the opening 34.

The fluid supply header 37B is connected to the supply port 35B, and is provided in the central portion of the bottom surface inside the housing-shaped main body 31. The large number of openings formed in the fluid supply header 37B face upward.

The fluid discharge header 38 is connected to the discharge port 36, and is provided adjacent to the side surface on the side of the opening 34 inside the housing-shaped main body 31 and below the opening 34. Further, the large number of openings formed in the fluid discharge header 38 face the fluid supply header 37A.

The fluid supply headers 37A and 37B supply the supercritical fluid 70 into the main body 31. The fluid discharge header 38 guides and discharges the supercritical fluid 70 inside the main body 31 to the outside of the main body 31. The supercritical fluid 70 discharged to the outside of the main body 31 via the fluid discharge header 38 contains the IPA liquid 71 (see FIG. 7) dissolved in the supercritical fluid 70 from the front surface of the wafer W.

The supercritical fluid 70 is supplied into the main body 31 through the openings of the fluid supply headers 37A and 37B arranged as described above, and the supercritical fluid 70 is discharged from the main body 31 through the openings of the fluid discharge header 38. Thus, a laminar flow of the supercritical fluid 70 that flows in a predetermined orientation around the wafer W is formed inside the main body 31.

For example, the laminar flow of the supercritical fluid 70 flows from the fluid supply header 37A toward the upper portion of the opening 34 along the front surface of the wafer W above the wafer W. Further, the laminar flow of the supercritical fluid 70 turns downward at the upper portion of the opening 34, passes the vicinity of the opening 34, and flows toward the fluid discharge header 38.

In the example of the laminar flow, an opening (not illustrated) is formed between the wafer W on the holding plate 32 and the lid member 33 inside the drying unit 17, and the laminar flow of the supercritical fluid 70 passes through the opening.

From the viewpoint of reducing a load that may be applied to the wafer W when the supercritical fluid 70 is supplied into the main body 31 and when the supercritical fluid 70 is discharged from the main body 31, it is preferable to provide a plurality of fluid supply headers and a plurality of fluid discharge headers.

The drying unit 17 further includes a pressing mechanism (not illustrated). The pressing mechanism has a function of sealing the processing space by pressing the lid member 33 toward the main body 31 against an internal pressure generated by the supercritical fluid 70 in the supercritical state supplied into the processing space of the main body 31. Further, for example, a heat insulating material, a tape heater or the like may be provided on the surface of the main body 31 such that the supercritical fluid 70 supplied into the processing space can be maintained at a predetermined temperature.

Figure 5:
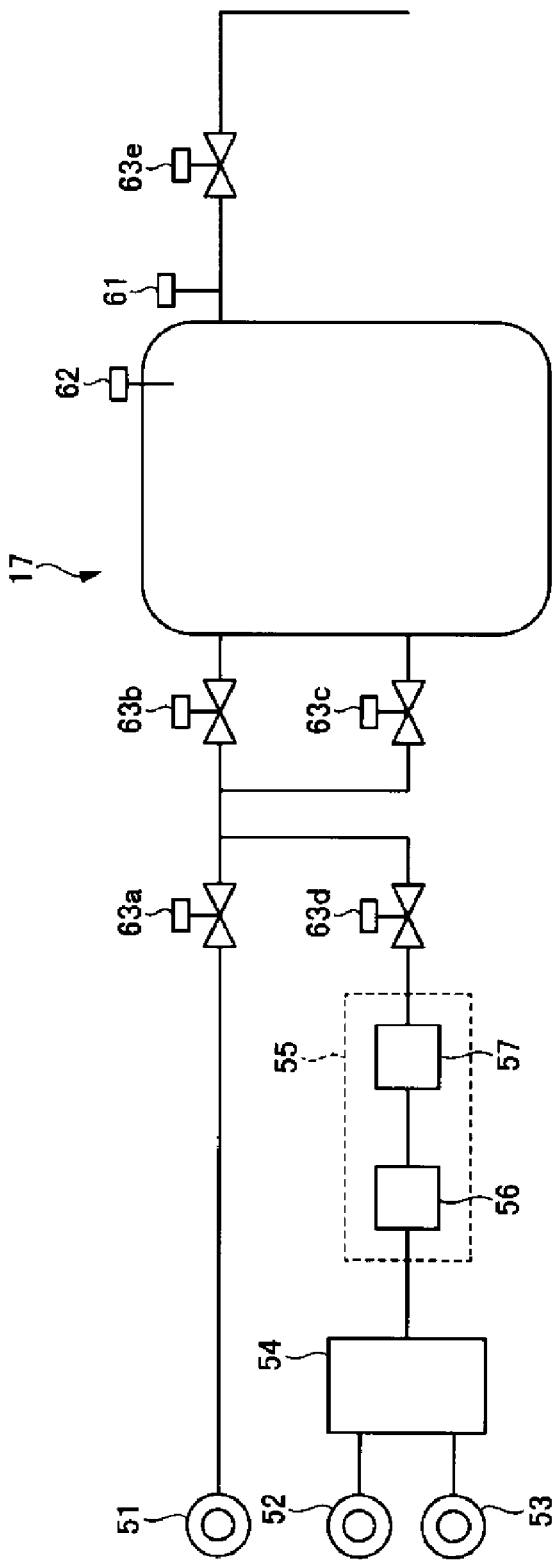
FIG. 5 is a view illustrating an exemplary configuration an entire system of the drying unit in the first embodiment.

Next, the configuration of the entire system of the drying unit 17 will be described with reference to FIG. 5. FIG. 5 is a view illustrating an exemplary configuration of the entire system of the drying unit 17 in the first embodiment.

In the entire system, a fluid source 51 is provided on the upstream side of the drying unit 17. The supercritical fluid 70 is supplied from the fluid source 51 to the supply line for circulating therethrough the supercritical fluid 70 (see FIG. 7) in the drying unit 17. In the fluid source 51 stores, for example, a raw material of $CO_2$ for generating the $CO_2$ supercritical fluid 70.

Further, a valve 63a and a valve 63b are sequentially provided between the fluid source 51 and the drying unit 17 from the upstream side toward the downstream side. The terms "upstream side" and "downstream side" used herein are defined based on the flow direction of the supercritical fluid 70 in the supply line.

The valve 63a is a valve that adjusts ON and OFF of the supply of the supercritical fluid 70 from the fluid source 51. When the valve 63a is opened, the supercritical fluid 70 flows through the supply line on the downstream side, and when the valve 63a is closed, the supercritical fluid 70 does not flow in the supply line on the downstream side. The supply line provided between the fluid source 51 and the drying unit 17 is an example of a second supply line.

The valve 63b is a valve for adjusting ON/OFF of the supply of the supercritical fluid 70 to the drying unit 17. The supply line connected from the valve 63b to the drying unit 17 is connected to the supply port 35A illustrated in FIG. 4. The supercritical fluid 70 flowing through the valve 63b passes through the supply port 35A and the fluid supply header 37A and is supplied into the main body 31.

The supply line is branched between the valve 63a and the valve 63b. Specifically, from the supply line between the valve 63a and the valve 63b, a supply line is branched to be connected to the drying unit 17 via the valve 63 and extends.

The supply line connected to the drying unit 17 via the valve 63c is an auxiliary flow path for supplying the supercritical fluid 70 to the drying unit 17. The supply line is connected to the supply port 35B illustrated in FIG. 4. The supercritical fluid 70 flowing through the valve 63c is supplied into the main body 31 via the supply port 35B and the fluid supply header 37B.

On the upstream side of the drying unit 17, there is provided a source 52 of a liquid as a supercritical fluid used for the cleaning fluid diffusion process S3, for example, liquefied $CO_2$, and a source 53 of a solvent used for the cleaning fluid diffusion process S3. The solvent contains polar molecules, and the boiling point of the solvent is lower than that of IPA. The solvents include, for example, methanol, ethanol, acetone, or ethyl acetate. A mixing part 54 is provided between the sources 52 and 53 and the drying unit 17 to mix the liquid supplied from the source 52 and the solvent supplied from the source 53. A cleaning fluid generation part 55 is provided between the mixing part 54 and the drying unit 17 to generate a cleaning fluid 80 from the mixed liquid generated by the mixing part 54. The cleaning fluid generation part 55 has a pump 56 and a heater 57 arranged from the upstream side to the downstream side. A supply line of the cleaning fluid 80 toward the drying unit 17 is connected to the supply line of the supercritical fluid 70 via the valve 63d on the upstream side at the branch point between the valve 63a and the valve 63b.

The valve 63d is a valve for adjusting ON/OFF of the supply of the cleaning fluid 80 to the drying unit 17. When the valve 63d is opened, the cleaning fluid 80 flows through the supply line on the downstream side, and when the valve 63d is closed, the cleaning fluid 80 does not flow in the supply line on the downstream side. The supply line between the cleaning fluid generation unit 55 and the drying unit 17 is an example of a first supply line.

A valve 63e is provided on the downstream side of the drying unit 17. The valve 63e is a valve for adjusting ON/OFF of the discharge of the supercritical fluid 70 or the cleaning fluid 80 from the drying unit 17. When the supercritical fluid 70 or the cleaning fluid 80 is discharged from the drying unit 17, the valve 63e is controlled to be opened, and when the supercritical fluid 70 or the cleaning fluid 80 is not discharged from the drying unit 17, the valve 63e is controlled to be closed.

A pressure sensor configured to detect a pressure of the fluid and a temperature sensor configured to detect a temperature of the fluid are installed in the above-described supply lines, respectively. In the example illustrated in FIG. 5, a pressure sensor 61 is provided between the drying unit 17 and the valve 63e, and a temperature sensor 62 is provided to detect the temperature of the fluid in the drying unit 17. The pressure sensor and the temperature sensor may be installed at various points in the supply lines as necessary.

Figure 6:
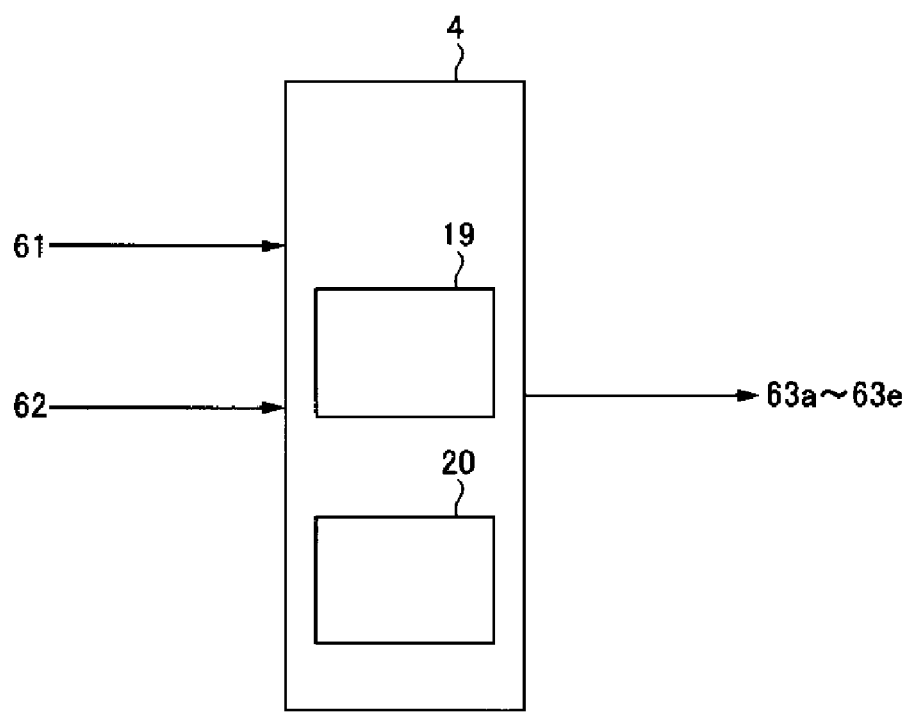
FIG. 6 is a block diagram illustrating a functional configuration of a control part.

FIG. 6 is a block diagram illustrating a functional configuration of the control part 4. As described above, the control part 4 includes the controller 19 and the storage 20. The control part 4 receives measurement signals from various elements illustrated in FIG. 5 and transmits control instruction signals to the various elements illustrated in FIG. 5.

For example, the control part 4 receives the measurement results obtained by the pressure sensor 61 and the temperature sensor 62, and transmits control instruction signals to the valves 63a to 63e. The signals that can be transmitted and received by the control part 4 are not particularly limited. The valves 63a and 63d are examples of valves that switch the fluid to be supplied to the substrate processing apparatus between the cleaning fluid and the supercritical fluid. A combination of the control part 4, the cleaning fluid generation part 55, the valves 63b to 63d, the supply lines between the cleaning fluid generation part 55 and the drying unit 17 constitutes a diffusing part.

<Outline of Drying Process Using Supercritical Fluid>

Next, the outline of the process of drying the IPA liquid 71 using the supercritical fluid 70 will be described. FIGS. 7A to 7D are views for explaining a drying mechanism of the IPA liquid 71, in which patterns P formed in the wafer W are schematically illustrated in enlarged cross-sectional views.

Figure 7A:
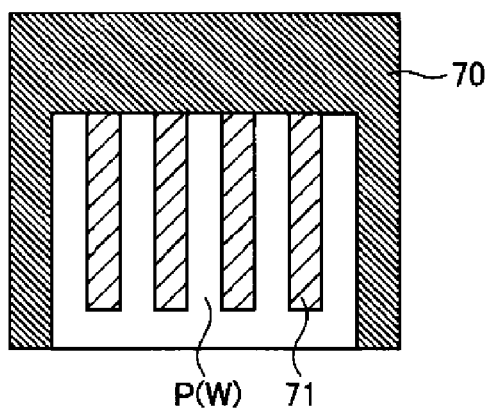
FIGS. 7A to 7D are views for explaining a IPA-based drying mechanism, in which patterns formed in a wafer are schematically illustrated in enlarged cross-sectional views.

At an initial stage in which the $CO_2$ supercritical fluid 70 is introduced into the main body 31 of the drying unit 17, only the IPA liquid 71 is filled between the patterns P as illustrated in FIG. 7A.

Figure 7B:
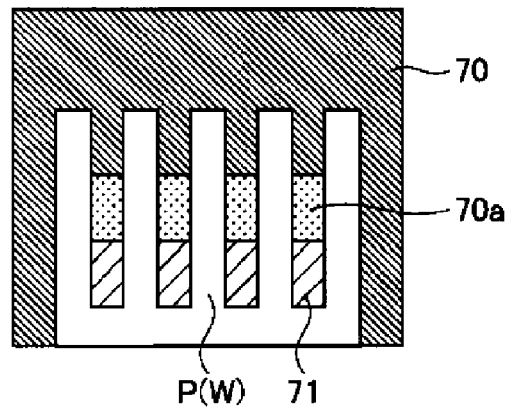

The IPA liquid 71 between the patterns P is gradually dissolved in the $CO_2$ supercritical fluid 70 by coming into contact with the $CO_2$ supercritical fluid 70, and is gradually replaced with the supercritical fluid 70, as illustrated in FIG. 7B. At this time, in addition to the IPA liquid 71 and the $CO_2$ supercritical fluid 70, a mixed fluid 70a of the IPA liquid 71 and the $CO_2$ supercritical fluid 70 exists between the patterns P.

Figure 7C:
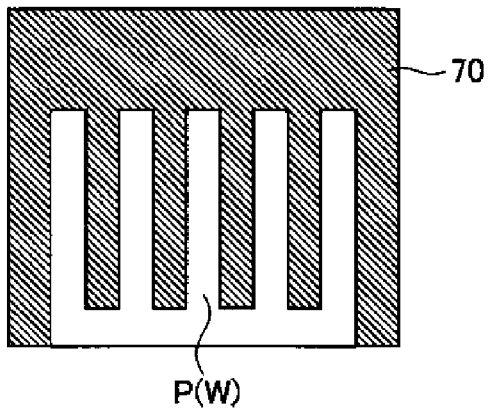

As the replacement of the IPA liquid 71 with the $CO_2$ supercritical fluid 70 progresses between the patterns P, the IPA liquid 71 is removed from the patterns P, and finally, the patterns P are filled only with the $CO_2$ supercritical fluid 70, as illustrated in FIG. 7C.

Figure 7D:
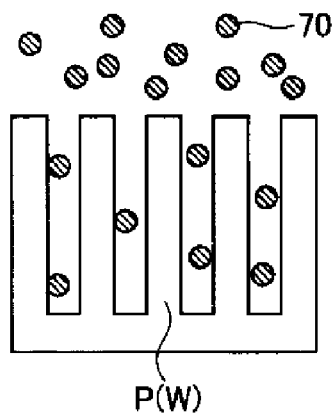

After the IPA liquid 71 is removed from the patterns P, the internal pressure of the main body 31 is reduced to the atmospheric pressure. As a result, as illustrated in FIG. 7D, the $CO_2$ supercritical fluid 70 is changed from the supercritical state to a gaseous state so that the patterns P are filled only with the gas. In this way, the IPA liquid 71 between the patterns P is removed, and the process of drying the wafer W is completed.

Here, in addition to the fact that the supercritical fluid 70 has a smaller viscosity than that of a liquid (e.g., the IPA liquid 71) and has a high ability to dissolve the liquid, an interface is hardly present between the supercritical fluid 70 and a liquid or gas that is in equilibrium with the supercritical fluid 70. As a result, in the above-described drying process using the supercritical fluid 70, the liquid can be dried without being affected by surface tension, which makes it is possible to suppress the collapse of the patterns P.

Meanwhile, in the drying process using the $CO_2$ supercritical fluid 70 in the substrate processing system 100 described thus far, the residue of the IPA may adhere to the wafer W. As a result of the earnest research conducted by the present inventors regarding the cause of IPA residue, it was found that, since the IPA contains polar molecules whereas $CO_2$ contains non-polar molecules, the IPA does not dissolve in $CO_2$ and IPA residue remains. Further, it was found that, by supplying a polar molecule solvent having a boiling point lower than that of the IPA together with the supercritical fluid to the drying unit 17, it is possible to remove the residue of the IPA from the interior of the drying unit 17 and to suppress the adhesion of the residue of the IPA to the wafer W.

<Details of Process of Cleaning Substrate Processing System>

Figure 9B:
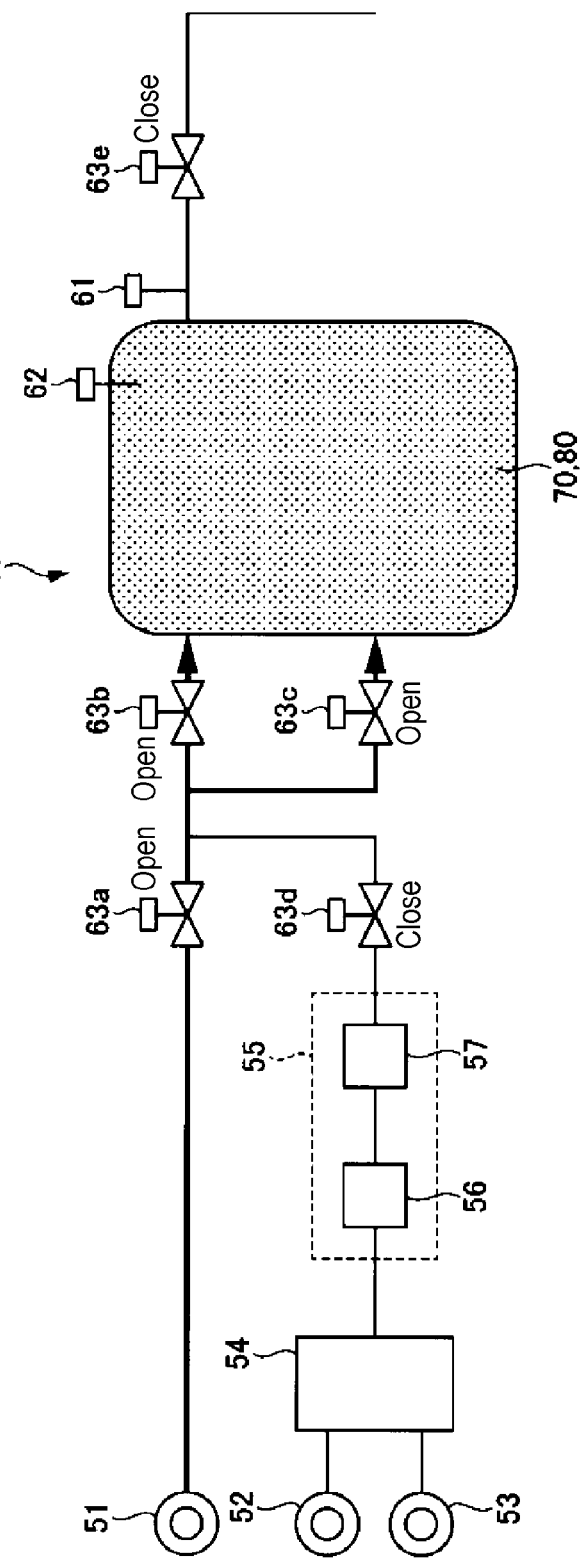
FIG. 9B is a view illustrating the outline of the process of cleaning the drying unit in the first embodiment.
Figure 9C:
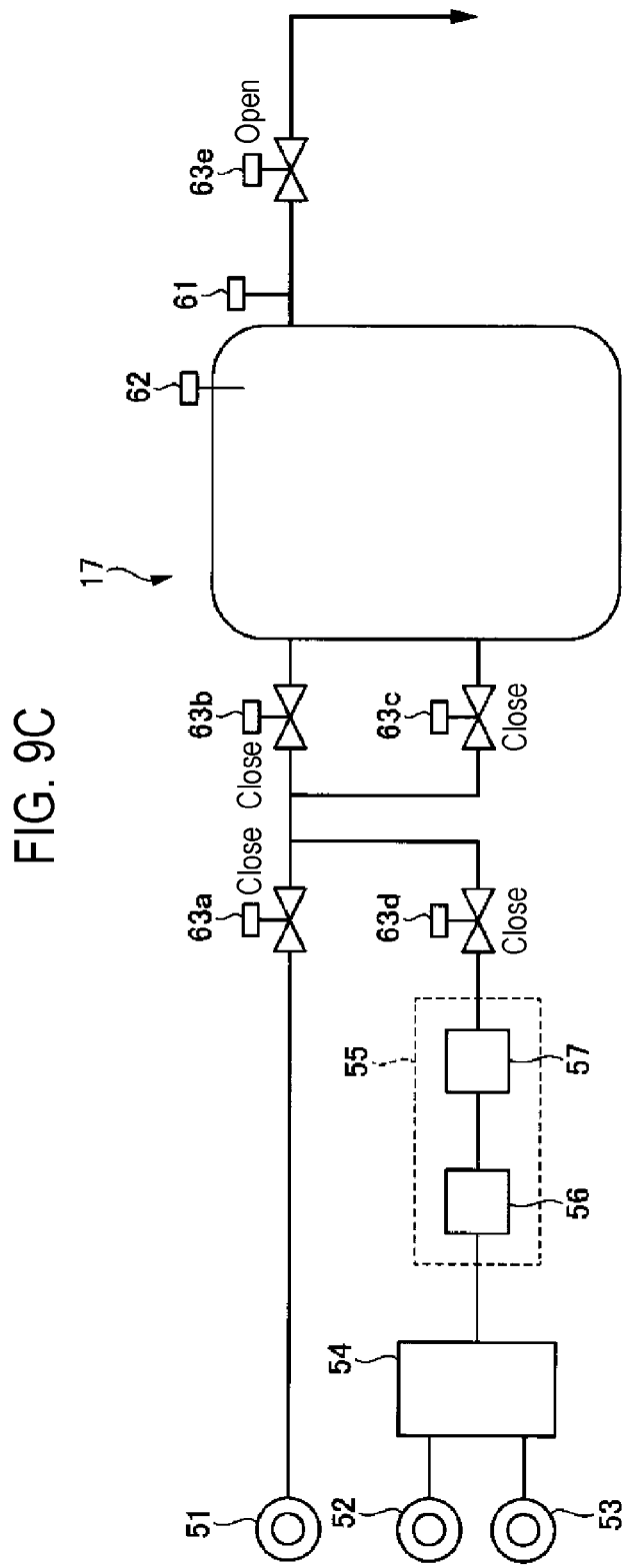
FIG. 9C is a view illustrating the outline of the process of cleaning the drying unit in the first embodiment.

Next, the details of a process of cleaning the drying unit 17 in the substrate processing system 100 according to the first embodiment will be described. FIG. 8 is a flowchart illustrating a process of cleaning the drying unit 17 in the first embodiment. FIGS. 9A to 9C are views illustrating an outline of the process of cleaning the drying unit 17 in the first embodiment. The process of cleaning the substrate processing system 100 illustrated in FIG. 8 is executed by the controller 19 which reads the program stored in the storage 20 of the control part 4 and controls the cleaning unit 16 and the drying unit 17 based on the read instruction.

In the first embodiment, first, in the mixing part 54, the liquid supplied from the source 52 (for example, the liquid $CO_2$) and the solvent supplied from the source 53 (for example, methanol, ethanol, or acetone) are mixed with each other to generate the mixed liquid (step S11).

Subsequently, in the cleaning fluid generation part 55, the liquid supplied from the source 52 in the mixed liquid is used as a supercritical fluid, and the cleaning fluid 80 in which the solvent and the supercritical fluid are mixed is generated (step S12). The solvent contained in the cleaning fluid 80 generated by the cleaning fluid generation part 55 may remain as liquid or may be vaporized in the cleaning fluid generation part 55.

Thereafter, the cleaning fluid 80 is diffused within the drying unit 17 (step S13). Specifically, as illustrated in FIG. 9A, the controller 19 of the control part 4 controls the valves 63a and 63e to be in the closed state, while controlling the valves 63b to 63d to be in the opened state. In addition, the internal temperature of the drying unit 17 is set to a temperature equal to or higher than the boiling point of the solvent. Through such control, the cleaning fluid 80 is supplied from the cleaning fluid generation part 55 into the drying unit 17 through the valves 63b to 63d, and diffuses within the drying unit 17. At this time, the solvent contained in the cleaning fluid 80 remains in a gaseous state. When the cleaning fluid 80 diffuses within the drying unit 17, the IPA residue is dissolved in the solvent contained in the cleaning fluid 80. Then, the cleaning fluid 80 is allowed to stand for a predetermined period of time in the state of being diffused within the drying unit 17. The standby time is, for example, 30 minutes or more.

Thereafter, the supercritical fluid 70 is diffused within the drying unit 17 (step S14). Specifically, as illustrated in FIG. 9B, the controller 19 of the control part 4 controls the valves 63d and 63e to be in the closed state, while controlling the valves 63a to 63c to be in the opened state. Through such control, the supercritical fluid 70 is supplied from the fluid source 51 into the drying unit 17 through the valves 63a to 63c, and diffuses within the drying unit 17. As a result, the interior of the drying unit 17 is filled with the supercritical fluid 70 and the cleaning fluid 80. While the interior of the drying unit 17 is filled with the supercritical fluid 70 and the cleaning fluid 80, the controller 19 performs control such that the interior of the drying unit 17 is kept at a temperature at which the supercritical fluid 70 can be maintained at the supercritical state. That is, in step S14, the controller 19 controls the drying process of the interior of the drying unit 17 using the supercritical fluid 70, similarly to the process of drying the wafer W.

Subsequently, the supercritical fluid 70 and the cleaning fluid 80 are discharged from the interior of the drying unit 17 (step S15). Specifically, as illustrated in FIG. 9C, the controller 19 of the control part 4 controls the valves 63a to 63d to be in the closed state, while controlling the valve 63e to be in the opened state. Through such control, the supercritical fluid 70 and the cleaning fluid 80 are discharged to the outside from the drying unit 17 through the valve 63e. Since the IPA residue is dissolved in the solvent contained in the cleaning fluid 80, the IPA residue can be removed together with the cleaning fluid 80. When the discharge of the cleaning fluid 80 is completed, the process of cleaning the drying unit 17 is completed. Further, the drying process using the supercritical fluid 70 is performed in step S14, and the drying process of the interior of the drying unit 17 is also completed.

As described above, according to the first embodiment, it is possible to easily remove the IPA residue inside the drying unit 17. Accordingly, it is possible to suppress the adhesion of particles to the wafer W. Moreover, since the boiling point of the solvent is lower than the boiling point of IPA, the solvent in which the IPA is dissolved can be easily discharged from the drying unit 17.

In the first embodiment, it is possible to clean, using the cleaning fluid 80, not only the interior of the drying unit 17, but also the interiors of the supply lines between the cleaning fluid generation part 55 and the drying unit 17 and the interior of the supply line on the downstream of the drying unit 17.

The processing procedure shown in FIG. 8 may be repeated in a single cleaning process. By repeatedly carrying out such a processing procedure in a single cleaning process, the residue of IPA in the drying unit 17 can be further removed.

The configurations of the mixing part 54 and the cleaning fluid generation part 55 are examples, and the configuration of the part that supplies the cleaning fluid to the drying unit 17 is not limited to the configuration of the first embodiment.

As an example, in each drying unit 17, the number of particles on the wafer W subjected to the drying process may be measured at any time using a particle counter. When the measured number of particles is equal to or more than a predetermined number, the cleaning process in the substrate processing system 100 may be performed.

Further, the cleaning process in the substrate processing system 100 may be performed, for example, when a cumulative time for which the drying process has been performed on the wafers W in each of the drying units 17 becomes a predetermined time or more, or when the cumulative number of wafers W on which the drying process has been performed becomes equal to or larger than a predetermined number.

Second Embodiment

Figure 10:
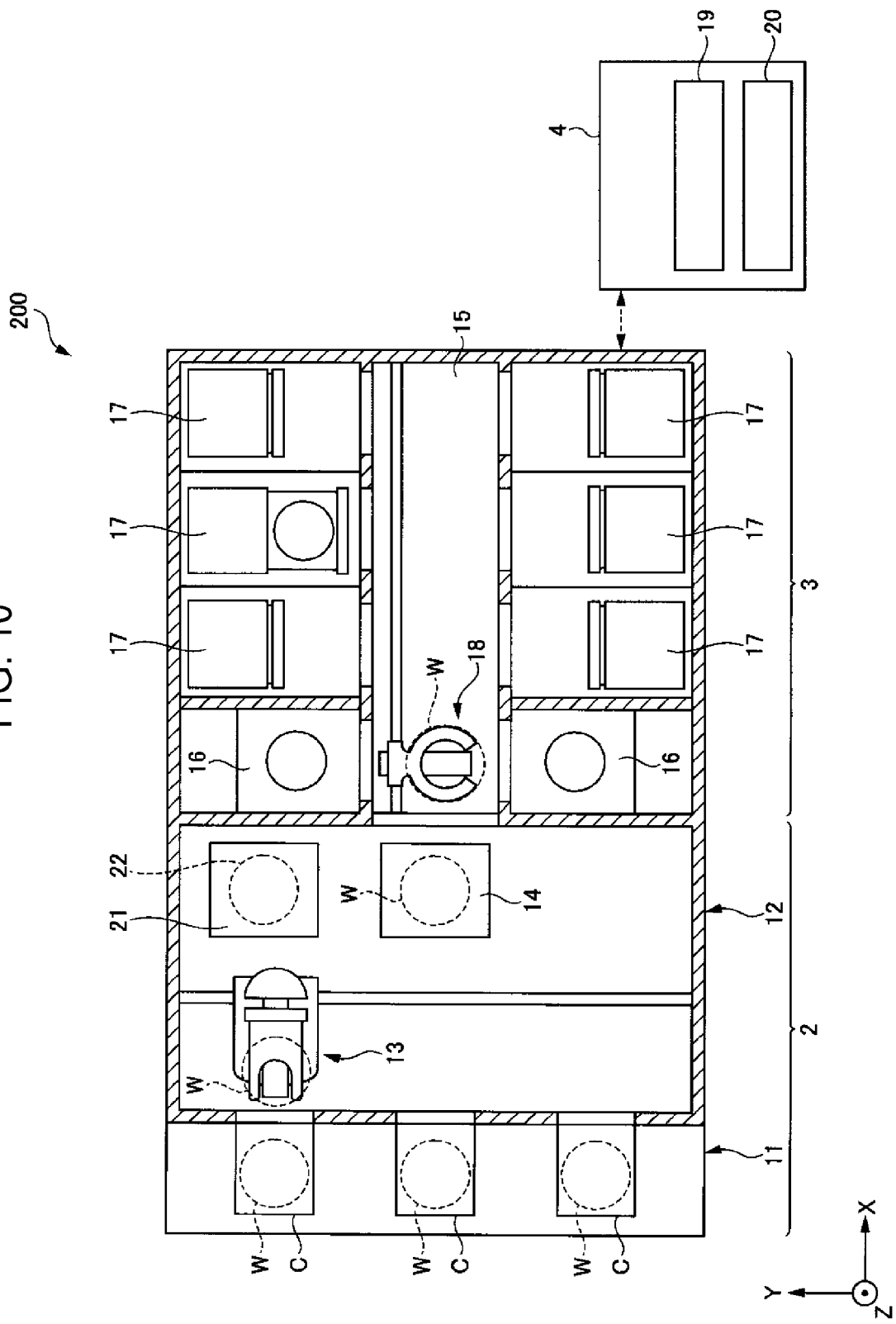
FIG. 10 is a view illustrating a schematic configuration of a substrate processing system according to a second embodiment.
Figure 11:
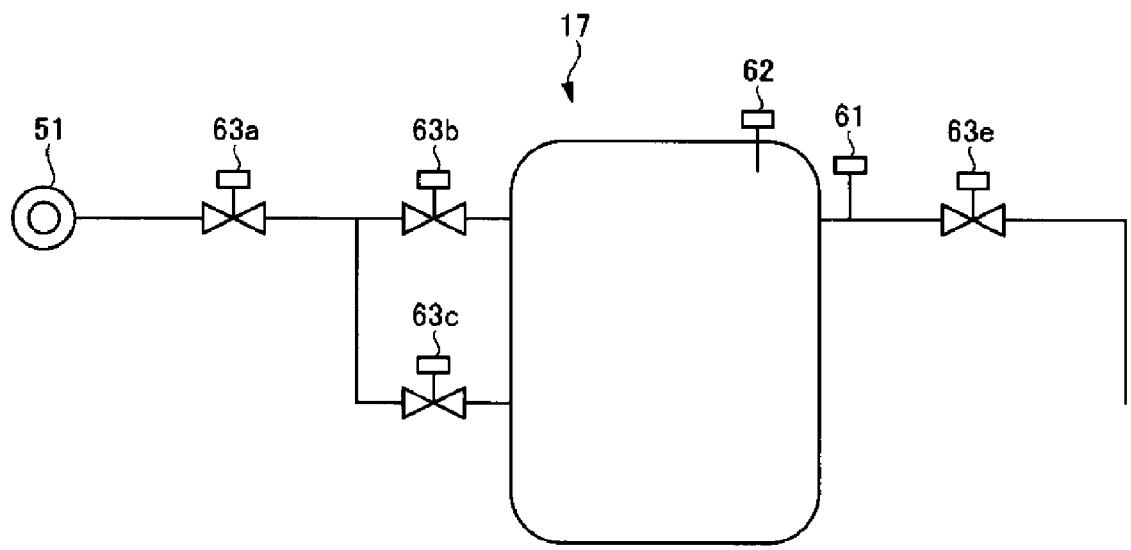
FIG. 11 is a view illustrating an exemplary configuration an entire system of a drying unit in the second embodiment.

Next, a second embodiment will be described. The second embodiment mainly differs from the first embodiment in that the second embodiment has a configuration in which the cleaning fluid 80 is diffused within the drying unit 17. FIG. 10 is a view illustrating a schematic configuration of a substrate processing system 200 according to the second embodiment. FIG. 11 is a view illustrating an exemplary configuration of the entire system of the drying unit 17 in the second embodiment.

As illustrated in FIG. 10, in the substrate processing system 200 according to the second embodiment, the transfer part 12 includes a jig placement part 21. A jig 22 is placed on the jig placement part 21. Here, the wafer holding mechanism of the above-described substrate transfer device 13 also has a function of holding the jig 22. The substrate transfer device 13 transfers the jig 22 between the jig placement part 21 and the delivery part 14 using the wafer holding mechanism.

In the second embodiment, the wafer holding mechanism of the substrate transfer device 18 may hold not only the wafer W but also the jig 22. The substrate transfer device 18 transfers the wafer W or the jig 22 between the delivery part 14, the cleaning unit 16, and the drying unit 17 using the wafer holding mechanism.

Further, the cleaning unit 16 illustrated in FIG. 3 is provided with a mechanism configured to collect a solvent 81 (see FIG. 13A) on the jig 22.

As illustrated in FIG. 11, the source 52, the source 53, the mixing part 54, the cleaning fluid generation part 55, and the valve 63d may be omitted.

Other components are the same as those in the first embodiment.

Figure 12:
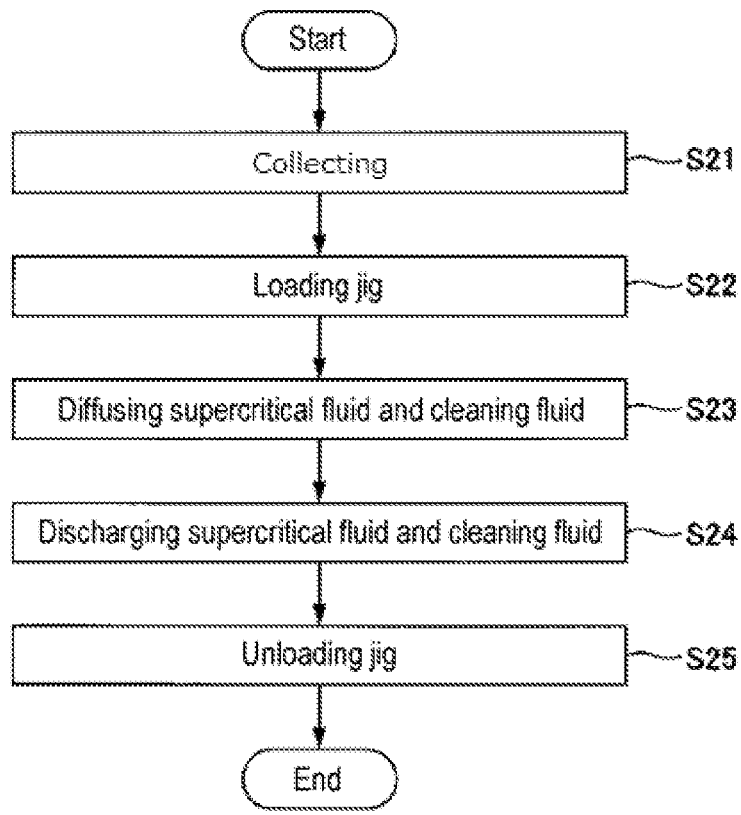
FIG. 12 is a flowchart illustrating a process of cleaning the drying unit in the second embodiment.
Figure 13A:
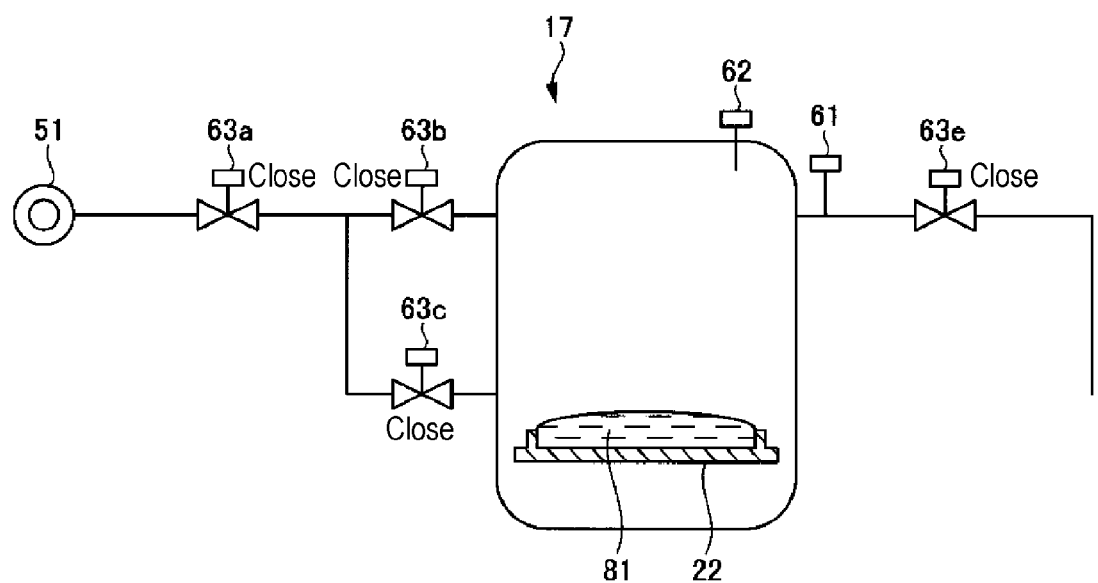
FIG. 13A is a view illustrating the outline of the process of cleaning the drying unit in the second embodiment.
Figure 13B:
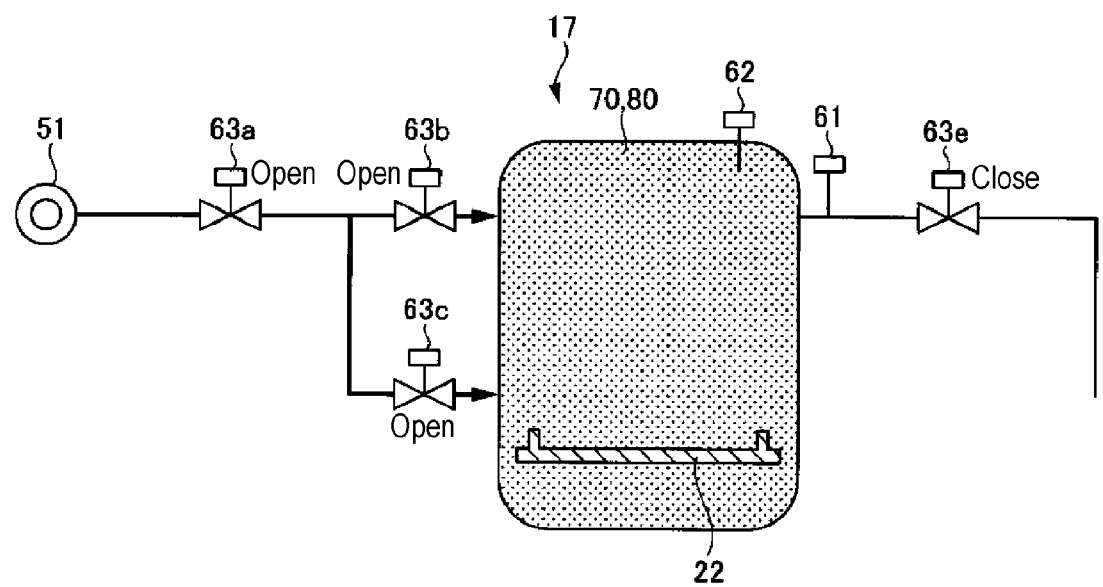
FIG. 13B is a view illustrating the outline of the process of cleaning the drying unit in the second embodiment.
Figure 13C:
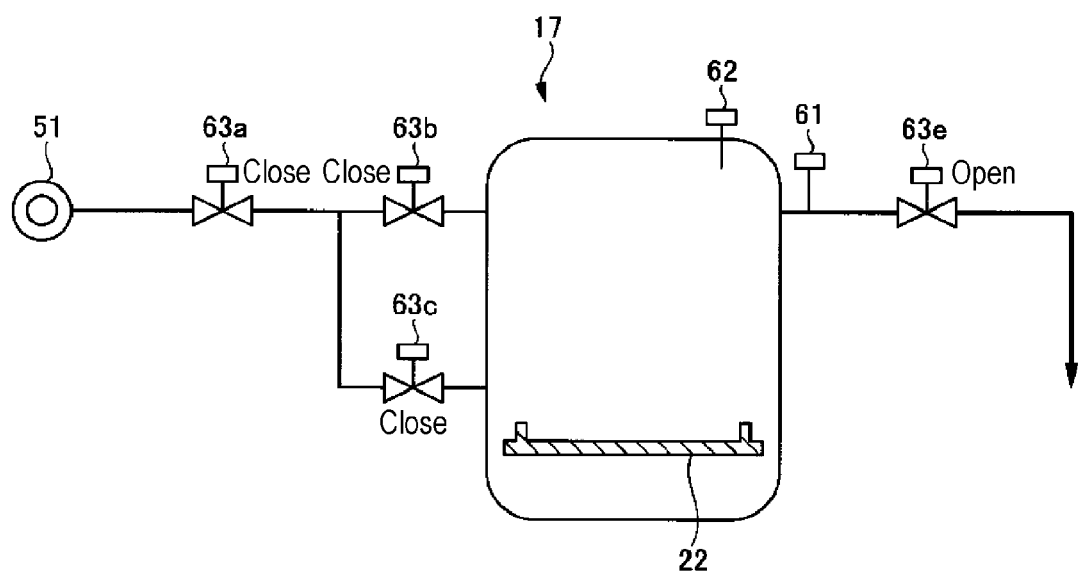
FIG. 13C is a view illustrating the outline of the process of cleaning the drying unit in the second embodiment.

Here, the details of a process of cleaning the drying unit 17 in the substrate processing system 200 according to the second embodiment will be described. FIG. 12 is a flowchart illustrating the process of cleaning the drying unit 17 in the second embodiment. FIGS. 13A to 13C are views illustrating an outline of the process of cleaning the drying unit 17 in the second embodiment.

In the second embodiment, first, the substrate transfer device 18 (see FIG. 10) loads the jig 22 into the cleaning unit 16. The jig 22 is held by the wafer holding mechanism 25 (see FIG. 3) in a state in which a ring-shaped portion 22b (see FIGS. 14A and 14B) faces upward. Thereafter, the controller 19 controls the cleaning unit 16 to collect the solvent 81 on the jig 22 (step S21).

The collection of the solvent 81 on the jig 22 is performed as follows. First, the substrate transfer device 13 of the loading/unloading station 2 illustrated in FIG. 10 picks up the jig 22 placed on the jig placement part 21, and transfers the same to the delivery part 14. The jig 22 placed on the delivery part 14 is picked up from the delivery part 14 by the substrate transfer device 18 of the processing station 3 and is loaded into the cleaning unit 16.

In the cleaning unit 16, the solvent 81 is collected on the jig 22 loaded into the cleaning unit 16. Specifically, in the cleaning unit 16, the nozzle arm 26 moves to a position above the jig 22 held by the wafer holding mechanism 25 illustrated in FIG. 3, and the solvent 81 is supplied from a solvent nozzle (not illustrated) provided at the tip end of the nozzle arm 26, so that the solvent 81 is collected on the jig 22.

Subsequently, the substrate transfer device 18 unloads the jig 22 on which the solvent 81 is collected from the cleaning unit 16, and loads the jig 22 into the drying unit 17, as illustrated in FIG. 13A (step S22). The loading of the jig 22 is performed as follows. First, the jig 22 on which the solvent 81 is collected is held on the holding plate 32 (see FIG. 4). Thereafter, the holding plate 32 and the lid member 33 are accommodated in the main body 31 together with the jig 22 on which the solvent 81 is collected, and the opening 34 is sealed by the lid member 33. As illustrated in FIG. 13A, when the jig 22 is loaded, all of the valves 63a to 63c and 63e are controlled to be in the closed state.

Subsequently, the supercritical fluid 70 and the cleaning fluid 80 are diffused within the drying unit 17 (step S23). Specifically, as illustrated in FIG. 13B, the controller 19 of the control part 4 controls the valve 63e to be in the closed state, while controlling the valves 63a to 63c to be in the opened state. In addition, the internal temperature of the drying unit 17 is set to a temperature equal to or higher than the boiling point of the solvent. Through such control, the supercritical fluid 70 is supplied from the fluid source 51 to the interior of the drying unit 17 through the valves 63a to 63c, and the solvent 81 collected on the jig 22 is vaporized. The cleaning fluid 80 in which the supercritical fluid 70 and the vaporized solvent 81 are mixed together diffuses within the drying unit 17. When the cleaning fluid 80 diffuses within the drying unit 17, the IPA residue is dissolved in the solvent contained in the cleaning fluid 80. Then, the cleaning fluid 80 is allowed to stand for a predetermined period of time in the state of being diffused within the drying unit 17. In addition, the interior of the drying unit 17 is filled with the supercritical fluid 70 and the cleaning fluid 80. While the interior of the drying unit 17 is filled with the supercritical fluid 70 and the cleaning fluid 80, the controller 19 performs a control such that the interior of the drying unit 17 is kept at a temperature at which the supercritical fluid 70 can be maintained at the supercritical state. That is, in step S23, the controller 19 controls the drying process of the interior of the drying unit 17 using the supercritical fluid 70, similar to the process of drying the wafer W.

Subsequently, the supercritical fluid 70 and the cleaning fluid 80 are discharged from the interior of the drying unit 17 (step S24). Specifically, as illustrated in FIG. 13C, the controller 19 of the control part 4 controls the valves 63a to 63c to be in the closed state, while controlling the valve 63e to be in the opened state. Through such control, the supercritical fluid 70 and the cleaning fluid 80 are discharged to the outside from the drying unit 17 through the valve 63e. Therefore, the IPA residue inside the drying unit 17 can be removed together with the cleaning fluid 80.

Thereafter, the jig 22 is unloaded from the drying unit 17 (step S25). When the unloading of the jig 22 is completed, the cleaning process for the drying unit 17 is completed. Further, the drying process using the supercritical fluid 70 is performed in step S23, and the drying process of the interior of the drying unit 17 is also completed.

According to the second embodiment, the cleaning process can be implemented merely by installing the jig placement part 21 and the jig 22 inside the substrate processing system 200 without installing, for example, additional pipes or valves in the drying unit 17. Therefore, according to the second embodiment, the cleaning process for the drying unit 17 can be performed at a low cost.

The processing procedure illustrated in FIG. 12 may be repeatedly performed in one cleaning process. By repeatedly performing such a processing procedure in one cleaning process, the residue of IPA in the drying unit 17 can be further removed.

Figure 14A:
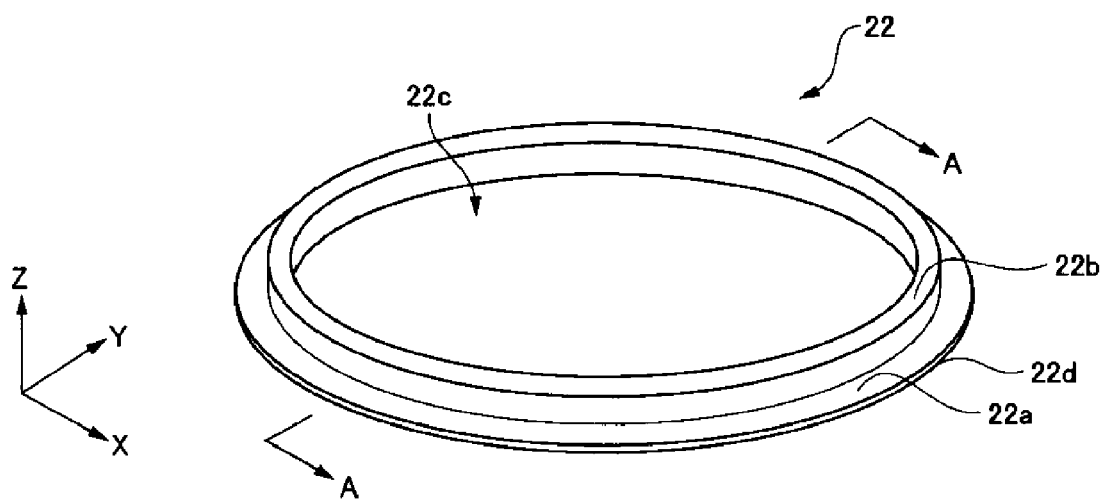
FIG. 14A is a perspective view illustrating an example of a jig.
Figure 14B:
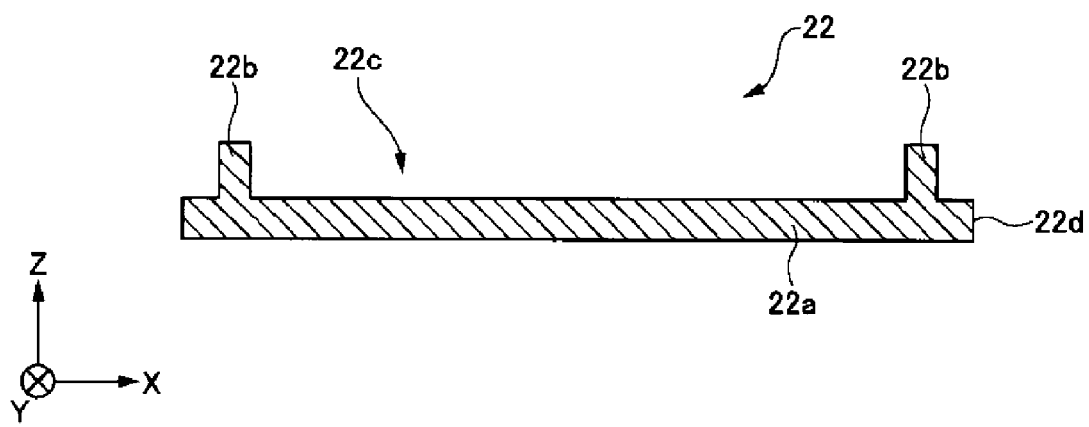
FIG. 14B is a cross-sectional view illustrating the example of the jig.

Next, an example of the jig 22 will be described with reference to FIGS. 14A and 14B. FIG. 14A is a perspective view illustrating an example of the jig 22, and FIG. 14B is a cross-sectional view showing the example of the jig 22. FIG. 14B corresponds to a cross-sectional view taken along line A-A in FIG. 14A.

As illustrated in FIGS. 14A and 14B, the jig 22 has a disc portion 22a and the ring-shaped portion 22b.

The disc portion 22a has a diameter and thickness that are substantially the same as the wafer W. As a result, in the substrate processing system 200, the jig 22 can be transferred using the substrate transfer device 13, the transfer part 14, and the substrate transfer device 18 used to transfer the wafer W, and can be loaded into the cleaning unit 16 or the drying unit 17, each of which is used for processing the wafer W.

In a case in which multiple types of wafers W having different diameters and thicknesses can be handled in the substrate processing system 200, the disc portion 22a may have a diameter and thickness substantially equal to those of one of the multiple types of wafers W that can be handled by the substrate processing system 200.

The ring-shaped portion 22b is a portion protruding in a ring shape from a front main surface of the disc portion 22a. The disc portion 22a and the ring-shaped portion 22b form a concave portion 22c in the front main surface of the disc portion 22a. By forming the concave portion 22c in the front main surface of the disc portion 22a, it is possible to increase the amount of the solvent 81 that can be collected on the front surface of the jig 22, compared with a case in which the concave portion 22c is not formed.

The ring-shaped portion 22b is provided spaced at a predetermined distance or more from an edge 22d of the disc portion 22a. As a result, in the substrate processing system 200, when the jig 22 is transferred using the substrate transfer device 13, the delivery part 14, and the substrate transfer device 18, it is possible to grip the edge 22d of the disc portion 22a so as to transfer the jig 22.

Third Embodiment

Next, a third embodiment will be described. The third embodiment has a configuration in which the second embodiment is combined with the first embodiment in configuration. That is, as illustrated in FIG. 10, the jig placement part 21 is provided in the transfer part 12, and the jig 22 is placed on the jig placement part 21. In addition, a mechanism configured to collect the solvent 81 on the jig 22 is additionally provided to the cleaning unit 16.

Other components are the same as those in the first embodiment. That is, unlike the second embodiment, the source 52, the source 53, the mixing part 54, the cleaning fluid generation part 55, and the valve 63d are provided (see FIG. 5).

Figure 15:
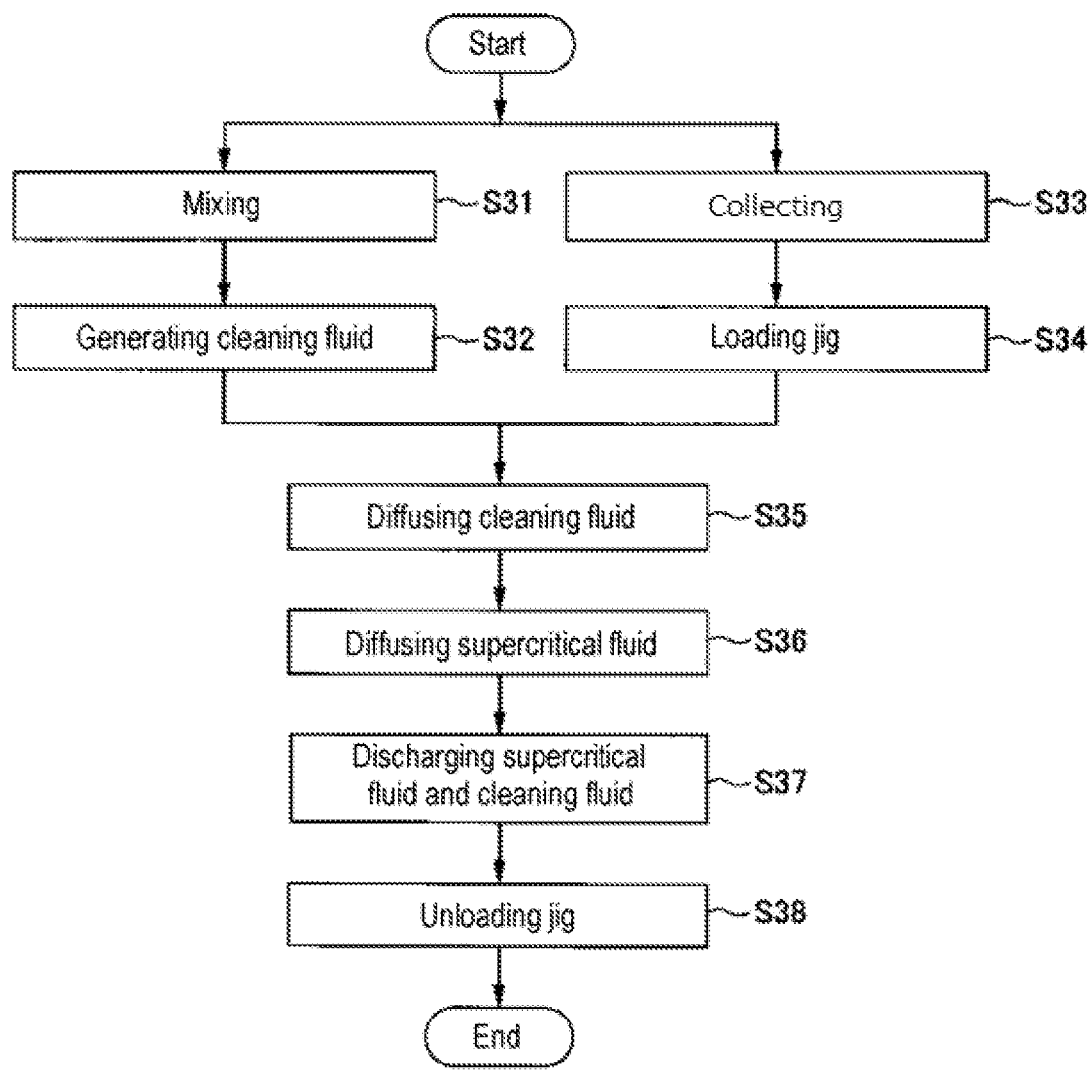
FIG. 15 is a flowchart illustrating a process of cleaning a drying unit in a third embodiment.

Next, the details of a process of cleaning the drying unit 17 in the substrate processing system according to the third embodiment will be described. FIG. 15 is a flowchart illustrating the process of cleaning the drying unit 17 in the third embodiment. FIGS. 16A to 16D are views illustrating an outline of the process of cleaning the drying unit in the third embodiment.

First, as in the first embodiment, in the mixing part 54, the liquid supplied from the source 52 and the solvent supplied from the source 53 are mixed together to generate a mixed liquid (step S31). Subsequently, a cleaning fluid 80 is generated in the cleaning fluid generation part 55 (step S32).

In addition, as in the second embodiment, the controller 19 controls the cleaning unit 16 to collect the solvent 81 on the jig 22 (step S33). Subsequently, the substrate transfer device 18 unloads the jig 22 on which the solvent 81 is collected from the cleaning unit 16 and loads the jig 22 into the drying unit 17, as illustrated in FIG. 13A (step S34). As illustrated in FIG. 16A, when the jig 22 is loaded, all of the valves 63a to 63e are controlled to be in the closed state.

Thereafter, the cleaning fluid 80 is diffused within the drying unit 17 (step S35). Specifically, as illustrated in FIG. 16B, the controller 19 of the control part 4 controls the valves 63a and 63e to be in the closed state, while controlling the valves 63b to 63d to be in the opened state. In addition, the internal temperature of the drying unit 17 is set to a temperature equal to or higher than the boiling point of the solvent. By such control, the cleaning fluid 80 is supplied from the cleaning fluid generation part 55 to the interior of the drying unit 17 through the valves 63b to 63d, and the solvent 81 collected on the jig 22 is vaporized. The cleaning fluid 80 containing the vaporized solvent 81 diffuses within the drying unit 17. When the cleaning fluid 80 diffuses within the drying unit 17, the IPA residue is dissolved in the solvent contained in the cleaning fluid 80. Then, the cleaning fluid 80 is allowed to stand for a predetermined period of time in the state of being diffused within the drying unit 17.

Figure 16C:
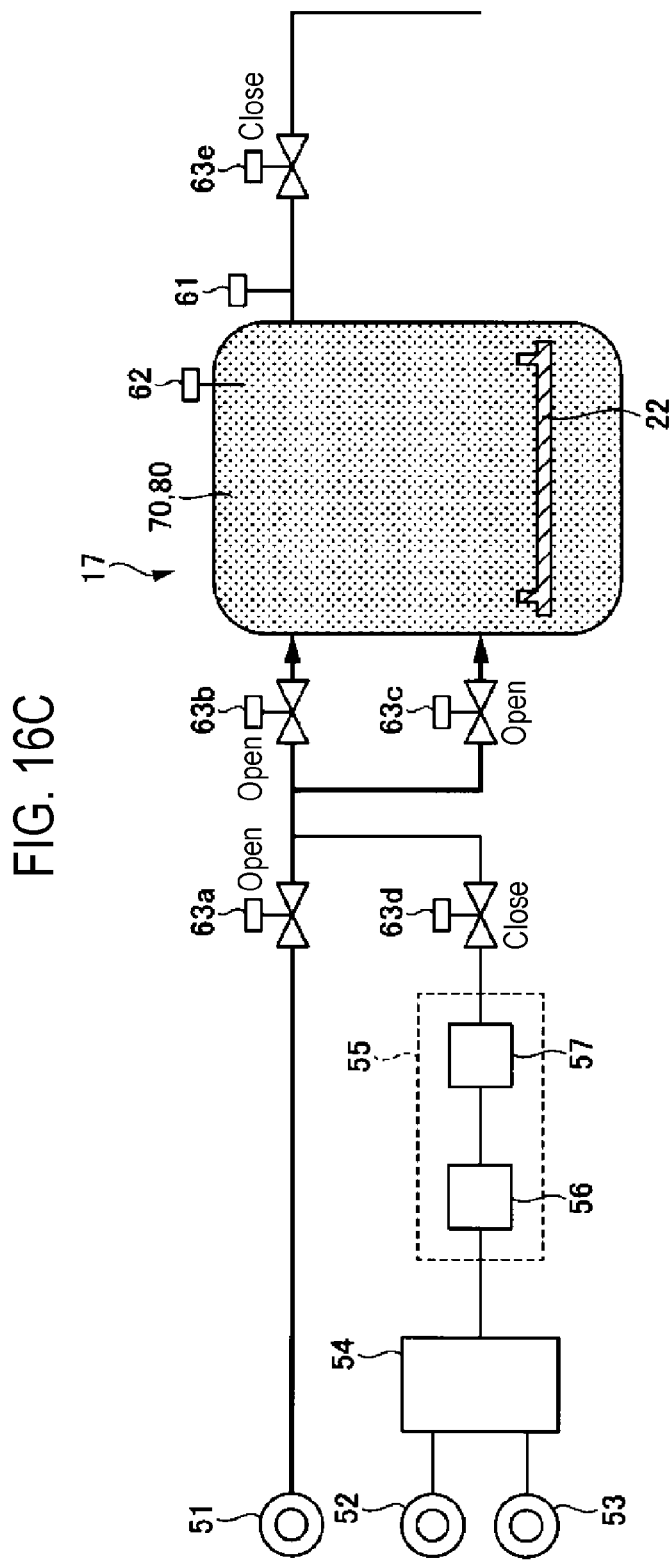
FIG. 16C is a view illustrating the outline of the process of cleaning the drying unit in the third embodiment.

Thereafter, the supercritical fluid 70 is diffused within the drying unit 17 (step S36). Specifically, as illustrated in FIG. 16C, the controller 19 of the control part 4 controls the valves 63d and 63e to be in the closed state, while controlling the valves 63a to 63c to be in the opened state. Through such control, the supercritical fluid 70 is supplied from the fluid source 51 into the drying unit 17 through the valves 63a to 63c, and diffuses within the drying unit 17. As a result, the interior of the drying unit 17 is filled with the supercritical fluid 70 and the cleaning fluid 80. While the interior of the drying unit 17 is filled with the supercritical fluid 70 and the cleaning fluid 80, the controller 19 performs control such that the interior of the drying unit 17 is kept at a temperature at which the supercritical fluid 70 can be maintained at the supercritical state. That is, in step S36, the controller 19 controls the drying process of the interior of the drying unit 17 using the supercritical fluid 70, similarly to the drying process of the wafer W.

Figure 16D:
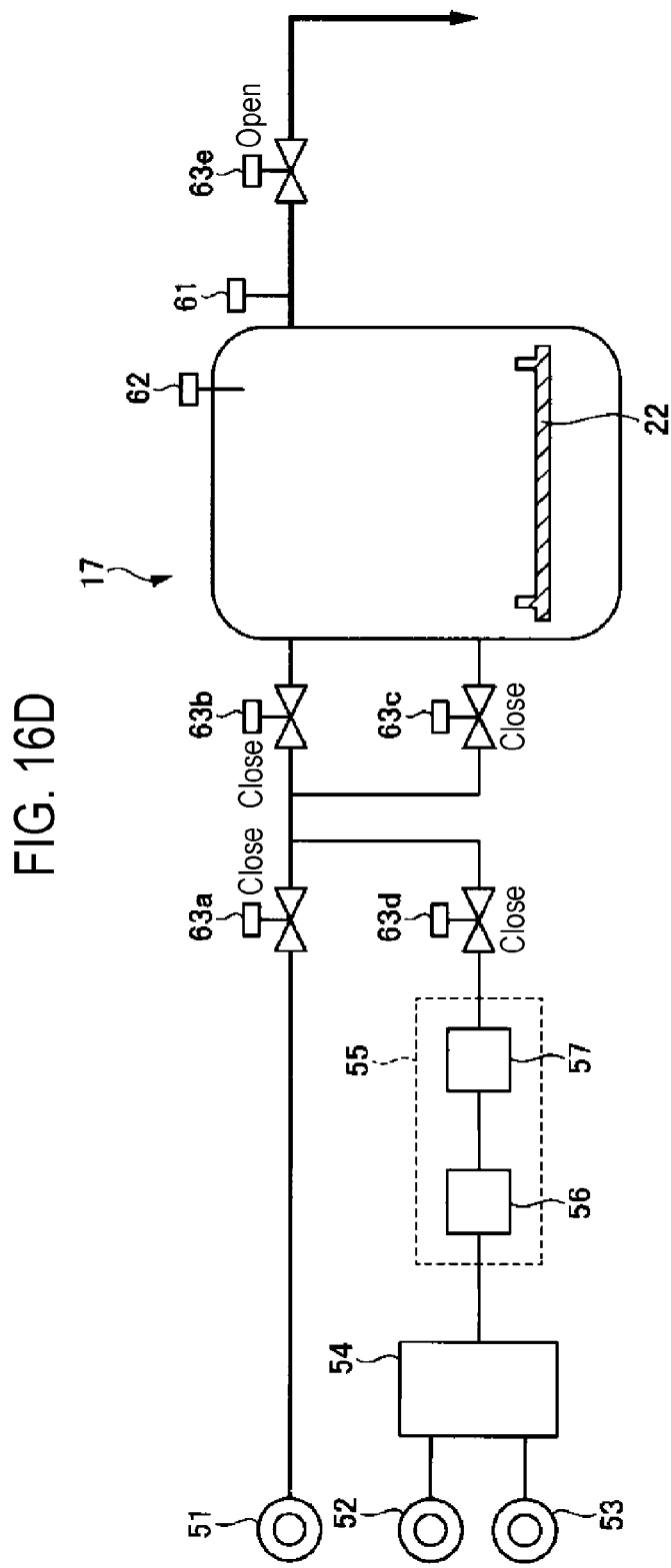
FIG. 16D is a view illustrating the outline of the process of cleaning the drying unit in the third embodiment.

Subsequently, the supercritical fluid 70 and the cleaning fluid 80 are discharged from the interior of the drying unit 17 (step S37). Specifically, as illustrated in FIG. 16D, the controller 19 of the control part 4 controls the valves 63a to 63d to be in the closed state, while controlling the valve 63e to be in the opened state. Through such control, the supercritical fluid 70 and the cleaning fluid 80 are discharged to the outside from the drying unit 17 through the valve 63e. Therefore, the IPA residue inside the drying unit 17 can be removed together with the cleaning fluid 80.

Thereafter, the jig 22 is unloaded from the drying unit 17 (step S38). When the unloading of the jig 22 is completed, the cleaning process for the drying unit 17 is completed. Further, the drying process using the supercritical fluid 70 is performed in step S36, and the drying process of the interior of the drying unit 17 is also completed.

According to the third embodiment, it is possible to achieve a higher cleaning effect. That is, it is possible to remove the IPA residue more reliably.

The processing procedure illustrated in FIG. 15 may be repeatedly performed in one cleaning process. By repeatedly performing such a processing procedure in one cleaning process, the IPA residue inside the drying unit 17 can be further removed.

Fourth Embodiment

Next, a fourth embodiment will be described. According to a research conducted by the present inventors, it was found that in the drying process S1, pollutants containing metal (hereinafter, sometimes simply referred to as "pollutants") adhere to the wafer as particles, and the pollutants do not react with the supercritical fluid. The metal is, for example, a transition metal. Further, it was also found that, by supplying a chelating agent that reacts with metal together with the supercritical fluid to the drying unit 17, it is possible to remove the pollutants from the interior of the drying unit 17 and to suppress the adhesion of the pollutants to the wafer. The fourth embodiment is different from the first embodiment mainly in that the chelating agent is contained in the cleaning fluid instead of the solvent. FIG. 17 is a view illustrating an exemplary configuration of the entire system of the drying unit 17 in the fourth embodiment.

As illustrated in FIG. 17, in the fourth embodiment, a source 153 of a solution containing a chelating agent is provided in place of the solvent source 53. A mixing part 154 is provided between the sources 52 and 153 and the drying unit 17 to mix the liquid supplied from the source 52 and the solution supplied from the source 153. A cleaning fluid generation part 155 is provided between the mixing part 154 and the drying unit 17 to generate a cleaning fluid 180 (see FIG. 18) from the mixed liquid generated by the mixing part 154. The cleaning fluid generation part 155 has a pump 56 and a heater 57 arranged from the upstream side to the downstream side. A supply line of the cleaning fluid 180 toward the drying unit 17 is connected to the supply line of the supercritical fluid 70 via a valve 63f on the upstream side of the branch point between the valve 63a and the valve 63b.

The valve 63f is a valve for adjusting ON/OFF of the supply of the cleaning fluid 180 to the drying unit 17. When the valve 63d is opened, the cleaning fluid 180 flows through the supply line on the downstream side, and when the valve 63a is closed, the cleaning fluid 180 does not flow in the supply line on the downstream side.

An example of the chelating agent supplied from the source 153 is represented in Chemical Formula 1. It is desirable for the chelating agent to have an atomic group that has affinity with the $CO_2$ used in the supercritical fluid. Examples of the atomic group having affinity with $CO_2$ may include perfluoropolyether (PFPE), dimethylpolysiloxane, and perfluorooctanoyl.

[Chemical Formula 1]

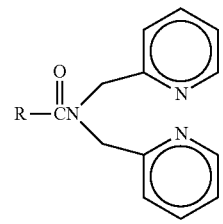

Other components are the same as those in the first embodiment.

Figure 18:
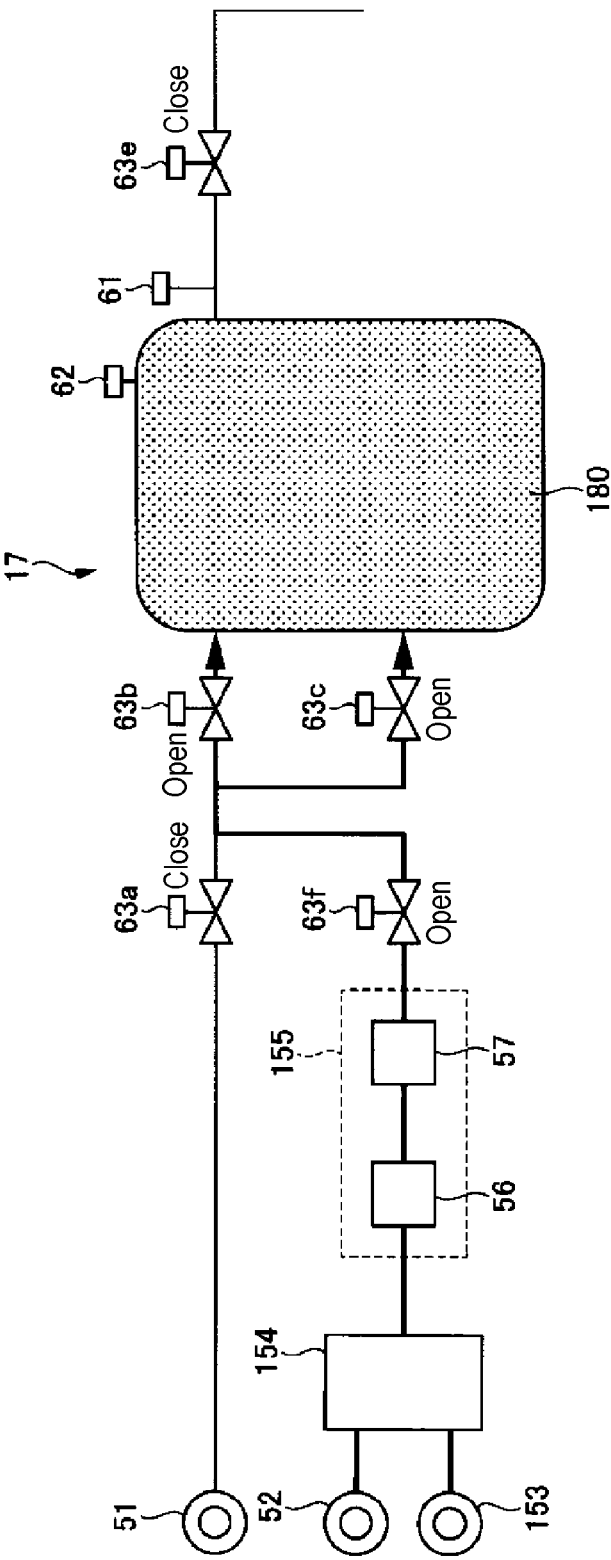
FIG. 18 is a view illustrating an outline of a process of cleaning the drying unit in the fourth embodiment.

Next, the details of a process of cleaning the drying unit 17 in the substrate processing system according to the fourth embodiment will be described. In this cleaning process, the cleaning process is performed in the same procedure as in the first embodiment as follows. FIG. 18 is a view illustrating an outline of the cleaning process for the drying unit in the fourth embodiment.

In the fourth embodiment, first, in the mixing part 154, the liquid supplied from the source 52 (for example, the liquid $CO_2$) and the solution containing a chelating agent supplied from the source 153 are mixed together to generate a mixed liquid.

Subsequently, in the cleaning fluid generation part 155, the liquid supplied from the source 52 in the mixed liquid is used as a supercritical fluid, and the cleaning fluid 180 in which the solution containing a chelating agent and the supercritical fluid are mixed with each other is generated.

Thereafter, the cleaning fluid 180 is diffused within the drying unit 17. Specifically, as illustrated in FIG. 18, the controller 19 of the control part 4 controls the valves 63a and 63e to be in the closed state, while controlling the valves 63b, 63c, and 63f to be in the opened state. Through such control, the cleaning fluid 180 is supplied from the cleaning fluid generation part 155 into the drying unit 17 through the valves 63b, 63c, and 63f, and diffuses within the drying unit 17. When the cleaning fluid 180 diffuses within the drying unit 17, metal ions (Mt) in the pollutants react with the chelating agent contained in the cleaning fluid 180 to produce complex as represented in Chemical Formula 2. Then, the cleaning fluid 180 is allowed to stand for a predetermined period of time in the state of being diffused within the drying unit 17. The standby time is, for example, 30 minutes or more.

[Chemical Formula 2]

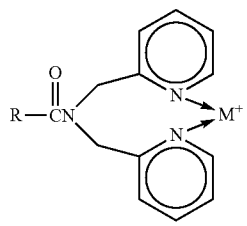

Subsequently, the cleaning fluid 180 is discharged from the interior of the drying unit 17. Specifically, as in the first embodiment, the controller 19 of the control part 4 controls the valves 61a to 63c and 63f to be in the closed state, while controlling the valve 63e to be in the opened state. Through such control, the cleaning fluid 180 is discharged to the outside from the drying unit 17 through the valve 63e. Since the metal in the pollutants reacts with the chelating agent contained in the cleaning fluid 180 to form the complex, the pollutants can be removed together with the cleaning fluid 180. When the discharge of the cleaning fluid 180 is completed, the cleaning process for the drying unit 17 is completed.

As described above, according to the fourth embodiment, it is possible to easily remove the pollutants inside the drying unit 17. Accordingly, it is possible to suppress the adhesion of particles to the wafer W. When the chelating agent has an atomic group having a high affinity with $CO_2$, the chelating agent can be further easily discharged from the drying unit 17.

As in the first embodiment, the processing procedure may be repeatedly performed in one cleaning process. By repeatedly performing such a processing procedure in one cleaning process, the IPA residue inside the drying unit 17 can be further removed.

As in the second embodiment, by loading the jig 22 on which the solution containing the chelating agent is collected into the drying unit 17 and vaporizing the solution, the cleaning fluid 180 containing the vaporized chelating agent may be diffused within the drying unit 17.

Further, as in the third embodiment, by supplying the cleaning fluid 180 in which the solution containing the chelating agent and the supercritical fluid are mixed from the cleaning fluid generation unit 155 to the drying unit 17, and vaporizing the cleaning fluid 180 containing the chelating agent, which is collected on the jig 22, the cleaning fluid 180 containing the vaporized chelating agent may be diffused within the drying unit 17.

Fifth Embodiment

Figure 19:
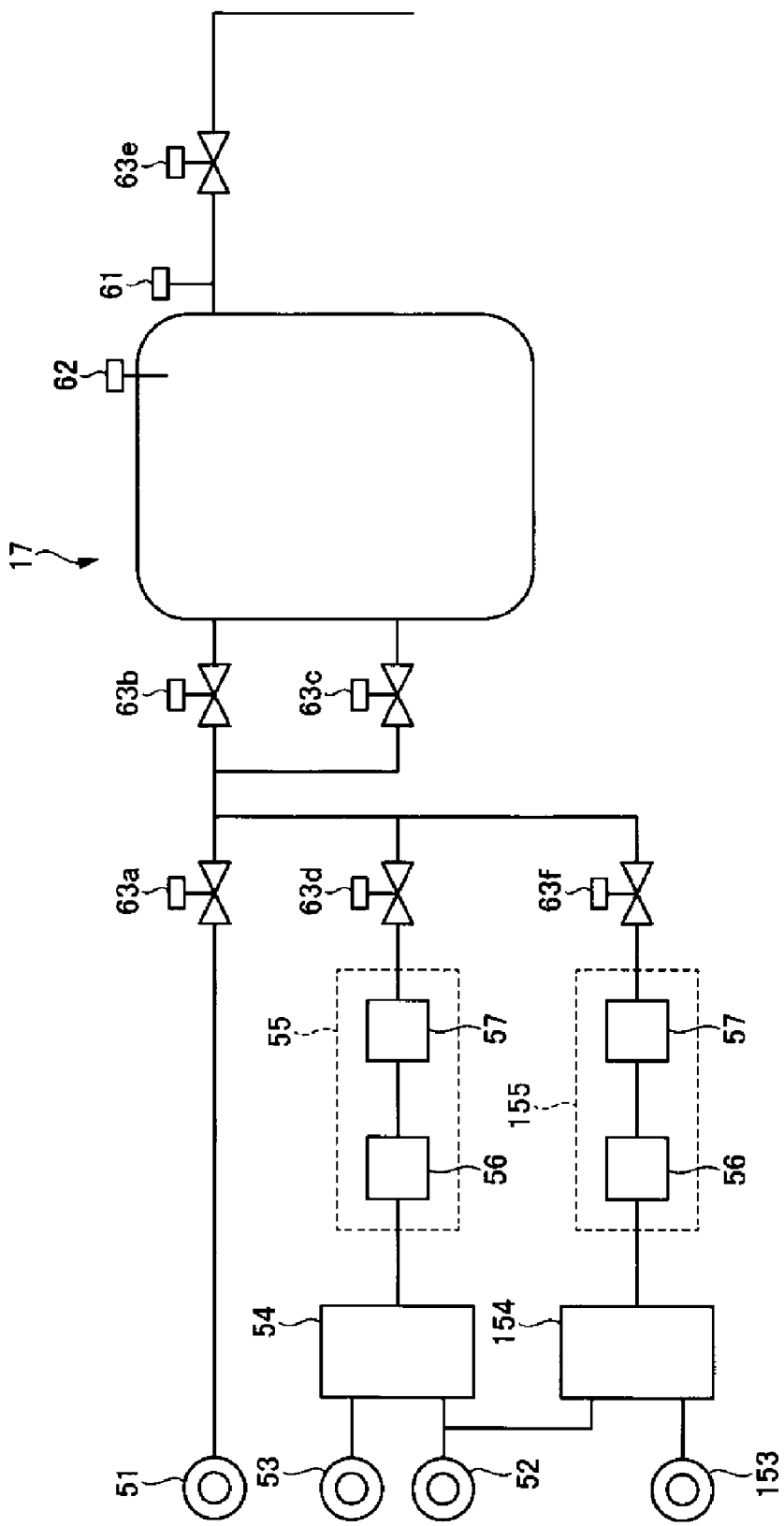
FIG. 19 is a view illustrating an exemplary configuration an entire system of a drying unit in a fifth embodiment.

Next, a fifth embodiment will be described. The fifth embodiment is different from the first embodiment mainly in that a cleaning fluid containing a chelating agent is used in addition to the cleaning fluid containing a solvent. FIG. 19 is a view illustrating an exemplary configuration of the entire system of the drying unit 17 in the first embodiment.

In the fifth embodiment, in addition to the source 52, the source 53, the mixing part 54, the cleaning fluid generation part 55, and the valve 63d, the source 153, the mixing part 154, the cleaning fluid generation part 155, and the valve 63f are provided on the upstream side of the drying unit 17, as in the fourth embodiment.

Other components are the same as those in the first embodiment.

In the process of cleaning the drying unit 17 in the substrate processing system according to the fifth embodiment, for example, IPA residue is removed using the cleaning fluid 80 as in the first embodiment, and then pollutants containing metal are removed using the cleaning fluid 180 as in the fourth embodiment.

According to the fifth embodiment, both the IPA residue inside the drying unit 17 and the pollutants including metal can be easily removed. Therefore, the adhesion of particles to the wafer W can be further suppressed.

In addition, the pollutants containing metal may be removed using the cleaning fluid 180 as in the fourth embodiment, and then the IPA residue may be removed using the cleaning liquid 80 as in the first embodiment. When the dissolution of the IPA residue and the formation of the complex with metal ions contained in the pollutants proceed independently of each other in a state in which the solvent 81 and the solution containing a chelating agent do not react with each other, the removal of the IPA residue and the removal of pollutants may be performed simultaneously.

According to the present disclosure in some embodiments, it is possible to prevent particles from adhering to a substrate during a drying process using a supercritical fluid.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning a substrate processing apparatus in which a drying process of drying a substrate whose surface was wet with a liquid has been performed by bringing the substrate into contact with a supercritical fluid, the method comprising:
   diffusing, after the drying process, a first cleaning fluid in an interior of the substrate processing apparatus such that a residue of the liquid in the interior of the substrate processing apparatus after the drying process is dissolved in the first cleaning fluid, the first cleaning fluid being obtained by mixing the supercritical fluid with a solvent containing polar molecules and having a lower boiling point than a boiling point of the liquid; and
   discharging the first cleaning fluid from the interior of the substrate processing apparatus, that occurs after the diffusing the first cleaning fluid.

2. The method of claim 1, wherein the liquid contains the polar molecules and the supercritical fluid contains non-polar molecules.

3. The method of claim 1, wherein the diffusing the first cleaning fluid includes:
   mixing the supercritical fluid with the solvent to obtain the first cleaning fluid outside the substrate processing apparatus; and
   supplying the first cleaning fluid from outside the substrate processing apparatus to the interior of the substrate processing apparatus.

4. The method of claim 1, wherein the diffusing the first cleaning fluid comprises:
   loading a jig on which the solvent is collected into the substrate processing apparatus; and
   vaporizing the solvent on the loaded jig in the interior of the substrate processing apparatus while supplying the supercritical fluid into the substrate processing apparatus.

5. The method of claim 1, wherein the liquid includes isopropyl alcohol, and the solvent includes ethanol, methanol, or acetone, or any combination thereof.

6. The method of claim 1, further comprising:
   diffusing a second cleaning fluid in the interior of the substrate processing apparatus, the second cleaning fluid being obtained by mixing the supercritical fluid with a chelating agent-containing solution; and
   discharging the second cleaning fluid from the interior of the substrate processing apparatus, that occurs after the diffusing the second cleaning fluid.

7. The method of claim 1, further comprising:
   diffusing an additional supercritical fluid in the interior of the substrate processing apparatus, that occurs between the diffusing the first cleaning fluid and the discharging the first cleaning fluid,
   wherein the discharging the first cleaning fluid further includes discharging the additional supercritical fluid from the interior of the substrate processing apparatus.

8. The method of claim 2, wherein the diffusing the first cleaning fluid includes:
   mixing the supercritical fluid with the solvent to obtain the first cleaning fluid outside the substrate processing apparatus; and
   supplying the first cleaning fluid from outside the substrate processing apparatus to the interior of the substrate processing apparatus.

9. The method of claim 2, wherein the diffusing the first cleaning fluid further comprises:
   loading a jig on which the solvent is collected into the substrate processing apparatus; and
   vaporizing the solvent on the loaded jig in the interior of the substrate processing apparatus while supplying the supercritical fluid into the substrate processing apparatus.

10. The method of claim 2, wherein the liquid includes isopropyl alcohol, and the solvent includes ethanol, methanol, or acetone, or any combination thereof.

11. The method of claim 2, further comprising:
    diffusing a second cleaning fluid in the interior of the substrate processing apparatus, the second cleaning fluid being obtained by mixing the supercritical fluid with a chelating agent-containing solution; and
    discharging the second cleaning fluid from the interior of the substrate processing apparatus, that occurs after the diffusing the second cleaning fluid.

12. The method of claim 2, further comprising:
    diffusing an additional supercritical fluid in the interior of the substrate processing apparatus, that occurs between the diffusing the first cleaning fluid and the discharging the first cleaning fluid,
    wherein the discharging the first cleaning fluid further includes discharging the additional supercritical fluid from the interior of the substrate processing apparatus.

13. The method of claim 3, wherein the liquid includes isopropyl alcohol, and the solvent includes ethanol, methanol, or acetone, or any combination thereof.

14. The method of claim 3, further comprising:
    diffusing a second cleaning fluid in the interior of the substrate processing apparatus, the second cleaning fluid being obtained by mixing the supercritical fluid with a chelating agent-containing solution; and
    discharging the second cleaning fluid from the interior of the substrate processing apparatus, that occurs after the diffusing the second cleaning fluid.

15. The method of claim 3, further comprising:
    diffusing an additional supercritical fluid in the interior of the substrate processing apparatus, that occurs between the diffusing the first cleaning fluid and the discharging the first cleaning fluid,
    wherein the discharging the first cleaning fluid further includes discharging the additional supercritical fluid from the interior of the substrate processing apparatus.

16. The method of claim 4, wherein the liquid includes isopropyl alcohol, and the solvent includes ethanol, methanol, or acetone, or any combination thereof.

17. The method of claim 4, further comprising:
    diffusing a second cleaning fluid in the interior of the substrate processing apparatus, the second cleaning fluid being obtained by mixing the supercritical fluid with a chelating agent-containing solution; and
    discharging the second cleaning fluid from the interior of the substrate processing apparatus, that occurs after the diffusing the second cleaning fluid.

18. The method of claim 4, further comprising:
diffusing an additional supercritical fluid in the interior of the substrate processing apparatus, that occurs between the diffusing the first cleaning fluid and the discharging the first cleaning fluid,
wherein the discharging the first cleaning fluid further includes discharging the additional supercritical fluid from the interior of the substrate processing apparatus.

* * * * *